(12) United States Patent
Huff et al.

(10) Patent No.: US 12,297,529 B1
(45) Date of Patent: May 13, 2025

(54) METHOD AND SYSTEM FOR CONTROLLING THE STATE OF STRESS IN DEPOSITED THIN FILMS

(71) Applicant: CORPORATION FOR NATIONAL RESEARCH INITIATIVES, Reston, VA (US)

(72) Inventors: Michael A. Huff, Oakton, VA (US); Paul Sunal, Arlington, VA (US)

(73) Assignee: Corporation for National Research Initiatives, Reston, VA (US)

( * ) Notice: Subject to any disclaimer, the term of this patent is extended or adjusted under 35 U.S.C. 154(b) by 0 days.

(21) Appl. No.: 16/547,118

(22) Filed: Aug. 21, 2019

Related U.S. Application Data

(62) Division of application No. 13/111,391, filed on May 19, 2011, now abandoned.

(60) Provisional application No. 61/346,178, filed on May 19, 2010.

(51) Int. Cl.
*C23C 14/54* (2006.01)
*C23C 14/22* (2006.01)
*C23C 14/24* (2006.01)

(52) U.S. Cl.
CPC .......... *C23C 14/545* (2013.01); *C23C 14/221* (2013.01); *C23C 14/24* (2013.01)

(58) Field of Classification Search
None
See application file for complete search history.

(56) References Cited

U.S. PATENT DOCUMENTS

| | | | |
|---|---|---|---|
| 4,683,758 A | 8/1987 | Hoffman et al. | |
| 5,444,302 A | 8/1995 | Nakajima et al. | |
| 5,480,529 A | 1/1996 | Kola et al. | |
| 5,834,374 A | 11/1998 | Cabral et al. | |
| 5,871,805 A | 2/1999 | Lemelson | C23C 16/52 427/10 |
| 6,139,699 A | 10/2000 | Chiang et al. | |
| 6,488,823 B1 | 12/2002 | Chiang et al. | |
| 2002/0093548 A1 | 7/2002 | Jarrold | B41J 2/14427 347/54 |

(Continued)

OTHER PUBLICATIONS

U.S. Appl. No. 13/111,473 of Huff et al., filed May 19, 2011.

(Continued)

*Primary Examiner* — Kelly M Gambetta
(74) *Attorney, Agent, or Firm* — Nixon & Vanderhye, P.C.

(57) ABSTRACT

A method and system for controlling the state of stress in deposited thin films are disclosed. According to the method and system, various process parameters, including: process pressure; substrate temperature; deposition rate; and ion-beam energies (controlled via the ion beam current, voltage, signal frequency and duty cycle) are varied using a step-by-step methodology to arrive at a pre-determined desired state of stress in thin films deposited using PVD. The method may be expressed as a computer algorithm, whereby the step-by-step procedure to obtain a pre-determined stress state, is coded for more efficient development and control of deposition processes. Alternatively, a closed-loop controlled PVD deposition system allows a pre-determined stress state of a thin film to be obtained quickly and efficiency using a feedback loop, algorithm and one or more sensors to monitor the substrate thin film stress and various process tool parameters.

73 Claims, 14 Drawing Sheets

(56) References Cited

U.S. PATENT DOCUMENTS

2002/0127438 A1 9/2002 Cook ................... C23C 14/22
 428/701
2005/0233089 A1 10/2005 Haag ................... H01J 37/34
 427/458
2007/0095651 A1 5/2007 Ye et al.

OTHER PUBLICATIONS

"The Material Science of Thin Films" by Milton Ohring, Academic Press, Oct. 20, 2001, pp. 93-95 and 227-229.
M.A. Huff, S.D. Senturia, and R.T. Howe, "A Thermally-Isolated Microstructure Suitable for Gas Sensing Applications", IEEE Solid-State Sensor and Actuator Meeting, Hilton Head, S.C., Jun. 6-9, pp. 47-50, 1988.

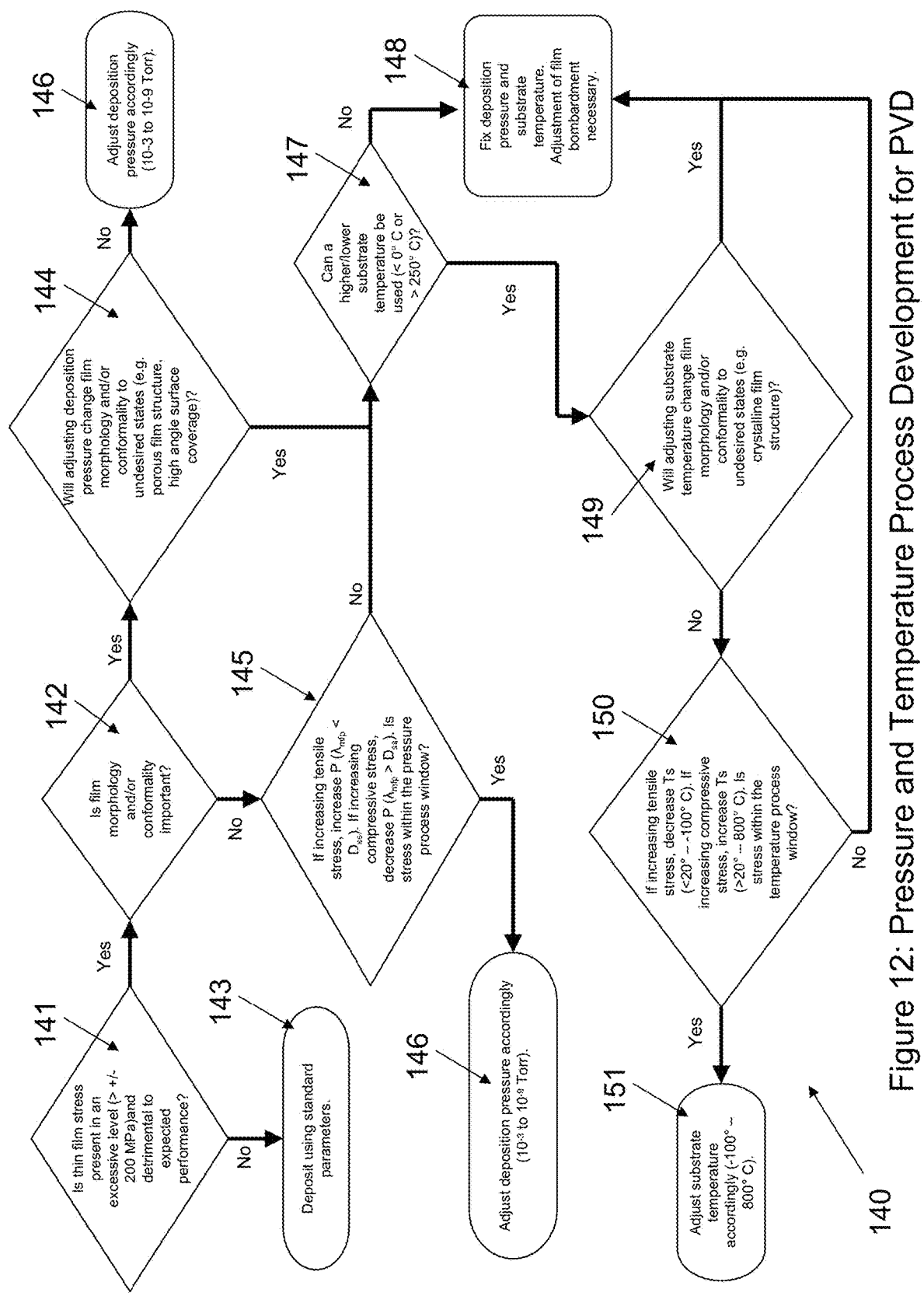
Figure 12: Pressure and Temperature Process Development for PVD

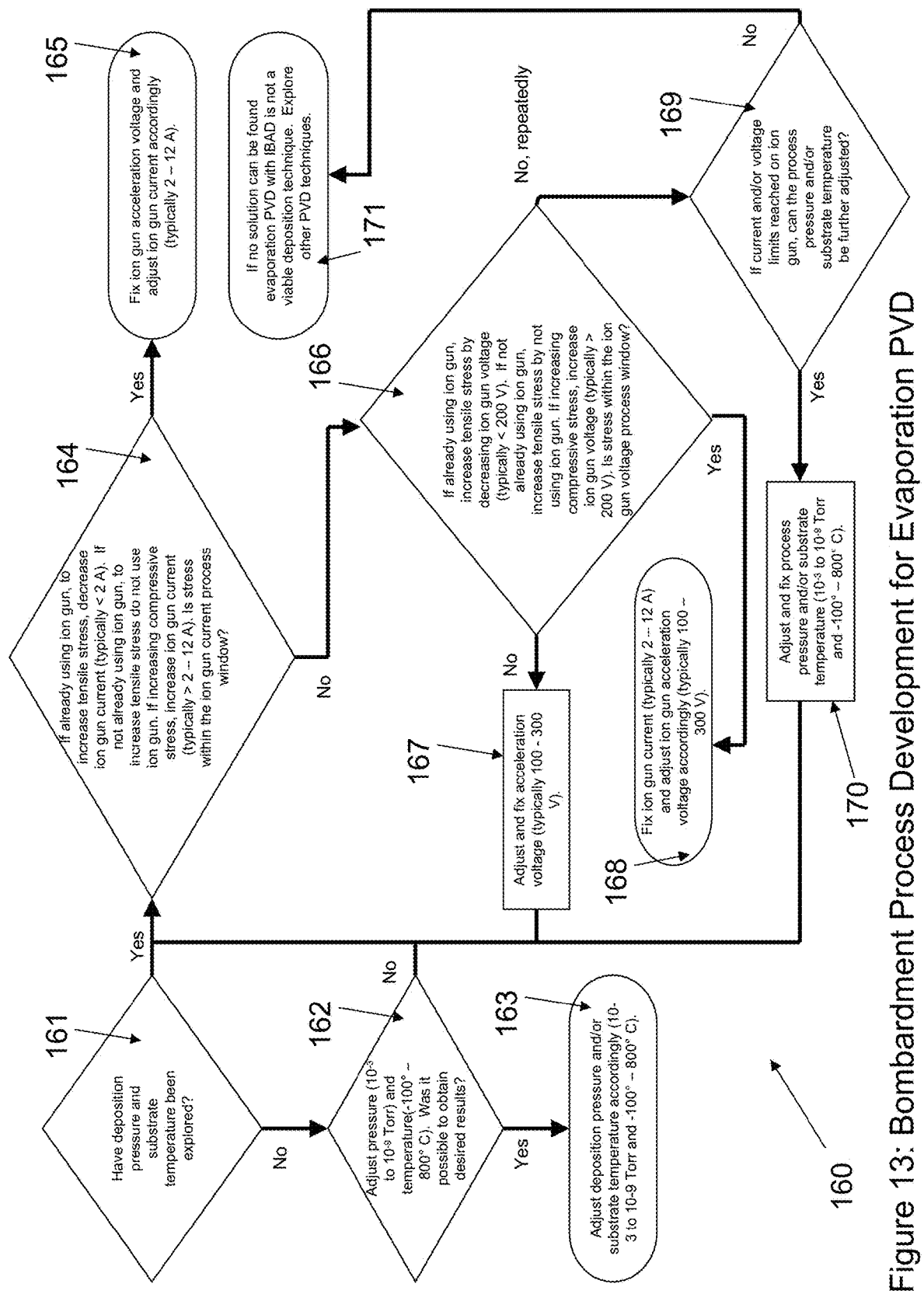
Figure 13: Bombardment Process Development for Evaporation PVD

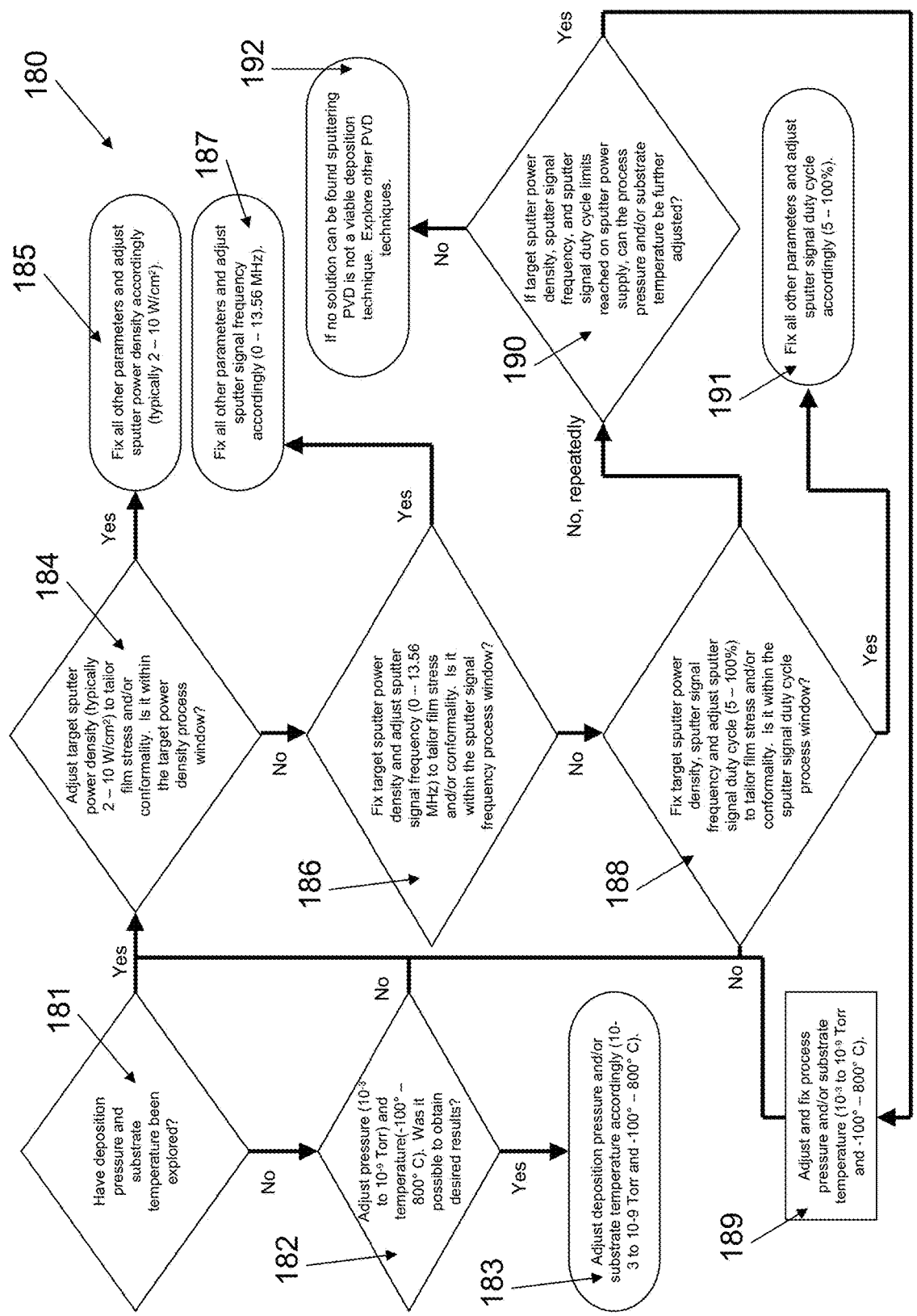
Figure 14: Bombardment Process Development for Sputtering PVD

METHOD AND SYSTEM FOR CONTROLLING THE STATE OF STRESS IN DEPOSITED THIN FILMS

CROSS-REFERENCES TO RELATED APPLICATIONS

This application is a division of U.S. patent application Ser. No. 13/111,391 filed May 19, 2011; which claims the benefit of Provisional Application No. 61/346,178, filed May 19, 2010, incorporated herein by reference.

FIELD OF INVENTION

The present invention is directed to a method and system for controlling the state of stress in deposited thin films to a pre-determined value. This invention has application in microelectronics, nanoelectronics, micro-electro-mechanical systems (MEMS), nano-electro-mechanical systems (NEMS), photonics, and in other fields of endeavor that employ deposited thin films using physical vapor deposition (PVD) to implement devices and structures.

BACKGROUND OF THE INVENTION

Many technologies, including, but not limited to, microelectronics, MEMS, NEMS, photonics, nanotechnology, employ thin film deposition as an integral part of the fabrication process, particularly technologies that use micro- and nano-fabrication techniques in their implementation. For example, many MEMS and NEMS devices, particularly those made using a category of fabrication called "surface micromachining," use one or more deposited thin films as the structural or active layer of the device. As a result, thin films are used where the properties, particularly mechanical properties, of the materials matter the most. For many MEMS and NEMS devices having a mechanical functionality, perhaps the most important material properties are the residual stress and stress gradient. Importantly, the stress state of MEMS and NEMS structural layers will have a huge impact on the resultant device's behavior and performance, and as such, should be accurately known and well controlled in device implementation. Ideally, these material properties should also be able to be tailored, or adjustable, over a range of values specific to the device performance and application requirements.

Currently used thin film deposition techniques almost always introduce significant residual stress and stress gradients in thin film layers. Moreover, using existing deposition techniques, the stress state has typically been difficult to either predict or control, especially in devices made from multilayer thin film structures.

Present understanding of the relationship between states of residual stress and the processing conditions through which thin films are deposited is typically very poor and at best highly qualitative. Consequently, it is extremely difficult to design and fabricate devices if the mechanical properties of the materials used are not known, able to be controlled, and cannot be deposited reproducibly.

Furthermore, uncontrolled residual stresses can induce a variety of highly undesirable consequences, and include, but are not limited to, cracking, delamination, deformation, and microstructural changes in the materials. The need to ensure thin film mechanical integrity through controlled stress states continues to be a technology limiting factor for the implementation of MEMS, NEMS and other devices and is not merely limited to applications where load carrying capacity is the sole function.

Another limitation of deposited thin films for use in micro- and nano-fabrication is that they are often too thin for many device applications, particularly those in MEMS technology applications. MEMS devices often require very high aspect ratios and thicker films in order to meet specific device performance requirements. Unfortunately, the high stress states of many deposited material layers preclude the deposition of thicker film layers (e.g., not more than 1 to 2 microns for some materials and not more than a few thousand Angstroms for some others). Adequate control of thin film stress in situ can remove these thickness limitations and allow extremely thick films, even layers more than 100 μm in thickness, to be deposited. Additionally, stress-related adhesion issues that currently plague certain useful materials (i.e., Pt, Ni, Mo, $MgF_2$) may be overcome by stress-minimization and enhanced adhesion from increased energy transfer during initial the stages of film growth.

Currently, there is extremely limited ability to control the stress states of deposited thin films and this is a severe challenge for micro- and nano-fabrication technologies. As a result, device development is more costly and time consuming, production yields are lower resulting in higher manufacturing costs, and the performance of devices will be limited. It also limits the thickness of the layers that can be deposited, thereby restricting the design and process freedom for device implementation.

There is a need for improved methods for the deposition of material layers wherein the stress can be tailored to the specific device design and application. The benefits of controlling the stress in deposited thin films for micro- and nano-device fabrication is truly enormous. The ability to make thin films having predictable, controlled and reproducible stress levels allows device designs to be implemented much faster and more inexpensively. Further, it will allow thicker films made by PVD deposition techniques, thereby providing far greater design latitude. Thin film stress control makes possible a near-zero stress film or stack of films, which is extremely useful for most micro- and nano-device applications. In short, deterministic stress control of deposited films is truly a useful and much needed technology development.

Current thin film deposition techniques used in micro- and nano-fabrication are open-loop systems. That is, there is no mechanism for determining material properties until after the deposition is completed and measurements are subsequently taken on the sample. Closed-loop feedback control of thin film deposition would provide in situ stress control, as well as repeatability and consistency of the material that was deposited. Pressure and deposition rate monitoring are commonly equipped on deposition systems and utilized during thin film deposition, while stress measuring is absent. While thorough process development and frequent post-deposition characterization will initially produce stress-controlled thin films, the degree of control is less than that obtained with in situ monitoring. Additionally, closed-loop feedback stress control is immune to deposition and hardware drift, as it compensates the processing parameters in real-time. Therefore, closed-loop control of the stress in thin film deposition would be a useful invention.

SUMMARY OF INVENTION

The present invention is directed to a method and system for controlling the state of stress in deposited thin films. The present invention has application in microelectronics, nanoelectronics, micro-electro-mechanical systems (MEMS), nano-electro-mechanical systems (NEMS), photonics, and in other fields of endeavor that employ deposited thin films using physical vapor deposition (PVD) to implement devices and structures.

The present invention allows tailorable, controlled, and reproducible stress states in thin films. The methods of the present invention can be applied to almost any known type and class of material that can be deposited by means of physical vapor deposition (PVD), which includes nearly all of the possible inorganic material choices for micro- and nano-device implementation. Specifically, the use of ion bombardment during deposition can achieve the goal of enabling control of the stress state of deposited films. Control over the deposition rate and pressure enable a further level of control over the resulting film stress-state to greatly enhance the design potential of micro- and nano-devices. Closed-loop control, whereby the stress of the film is able to be measured during deposition and the process parameters varied so as to obtain a pre-determined state of stress, is part of the present invention.

The present invention allows improved device performance levels to be obtained, greater device design freedom, lower development costs and time, and higher production yields with lower manufacturing costs.

BRIEF DESCRIPTION OF THE DRAWINGS

FIG. 12 is a flow chart diagram explaining the procedure to adjust the process pressure and substrate temperature for a PVD deposition process so as to control the stress in the deposited thin film. This flow chart can be used for both evaporation and sputtering PVD deposition processes.

FIG. 13 is a flow chart diagram explaining the procedure to adjust the ion-beam parameters as well as process pressure and substrate temperature so as to control the stress in evaporated PVD deposited thin films.

FIG. 14 is a flow chart diagram explaining the procedure to adjust the ion-beam parameters as well as process pressure and substrate temperature so as to control the stress in sputter PVD deposited thin films.

DETAILED DESCRIPTION OF THE INVENTION

Figure 1:
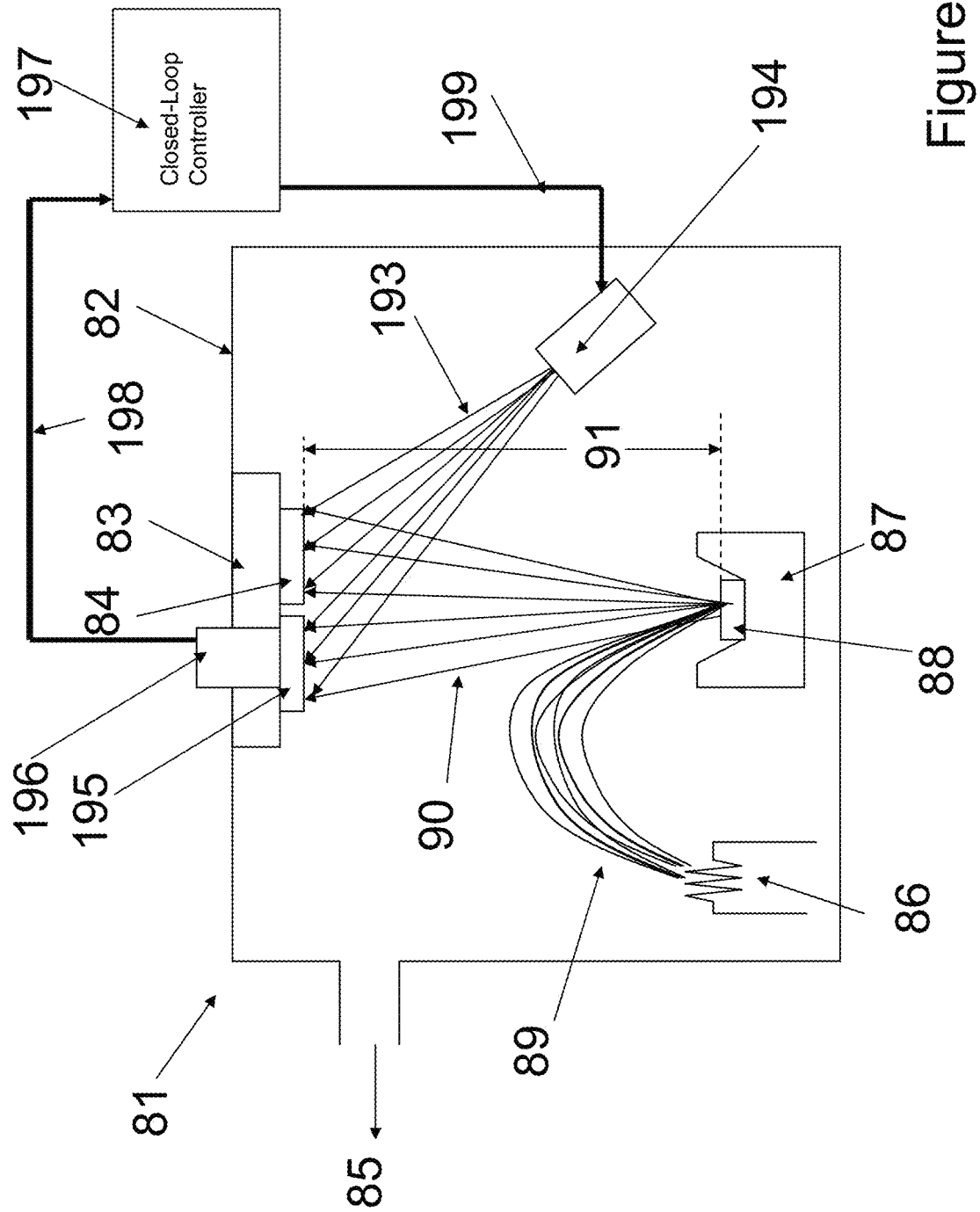
FIG. 1 is an illustration of an evaporative physical vapor deposition system that includes an ion beam source for ion-assisted deposition; a means for substrate temperature control allowing both heating and cooling of the substrate; a means for pressure measurement and control inside the deposition chamber; sensors to allow the stress and stress gradient to be measured during deposition; and a closed-loop control system allowing a desired and pre-determined stress state of the deposited thin film to be obtained.

The properties of the materials used in micro- and nano-fabrication, particularly the mechanical properties, have an enormous impact on device behavior and performance. It is well known in microelectronics fabrication that the electrical properties of the materials used must be very well controlled to achieve good transistor device performance. However, in order to achieve good performance in micro- and nano-devices for many technologies such as MEMS, NEMS, etc., mechanical as well as electrical, and potentially other material properties (e.g., optical, thermal, etc.) must also be very tightly controlled. This can be particularly challenging for thin-film materials used in micro- and nano-fabrication, since these materials will typically possess a range of values in the "as deposited state," depending on the exact processing conditions (i.e., deposition rate, temperature, etc.) used during the deposition of the thin-film material.

Presently, device designers and developers usually have no choice but to develop device designs without a priori knowledge of the properties of the materials used to implement the device. This is especially true for deposited thin films, since these types of materials tend to have the most variability. Consequently, for a thin-film layer used in a device in the "as-deposited" state, the properties of that material layer would not be known until they are measured.

Because of the lack of material property information, device development typically entails a considerable amount of trail and error in developing a device design and process sequence that provides an acceptable yield. Indeed, since the material properties have such a large impact on device behavior designers, developers are not able to predict the outcome of process sequences, that is, whether the initial process runs will yield any working devices. Instead, they usually rely on their experience and judgment to formulate a strategy, based on the principles of design of experiments (DOE) to characterize and optimize the material layers employed. As part of this, they will create designs for test structures that will be useful for measuring the properties of the materials used in the process sequence. Models for the properties of these materials are extremely useful in this regard; however, any of the design models, whether analytical or numerical, initially will not likely be based on accurate values for the material properties. Therefore, at the start of a micro- and nano-device development effort, the designers will need to make reasonable estimates of these values in their design, with the goal of "bounding the problem." Device designers and developers typically create an initial design having considerable variation in the dimensions of the devices' critical components as well as material property test structures. These test structures, although highly imperfect in practice, allow the collection of some measurement data of the important material properties, such as the residual stress of surface micromachined structural layers.

With the designs in hand, along with a set of planned process experiments, the work in the fabrication laboratory begins to develop the processing steps and ultimately the sequence. Much of this work is iterative at many levels. The development of process steps varies the processing parameters over a set of reasonable values, followed by measurement of the outcomes, which are then documented and statistically analyzed. Once parts of the process sequence are beginning to mature, test structures will be fabricated and measurements taken to determine accurate dimensions and the material property values. These values will be fed back into the design models and new models will be created. Once the process sequence starts to come together and working devices are beginning to be yielded from the runs, the design and models are further refined, new mask sets are created and the iterations continue. It is reasonable to expect that the first two or more cycles of a new and customized process sequence may not initially yield any working devices. It is also reasonable to expect that once working devices are beginning to be yielded on the runs, that the yields will be below 25%, although higher yields are possible. Obviously, the cost and development time are heavily influenced by the complexity of the process sequence for any device type. For example, it is not uncommon to see very large development costs (e.g., in excess of $50M) for MEMS devices.

In short, the inability to have known and reproducible material properties is a major cause of the high cost and long time for micro- and nano-device development and can also make device development an unattractive business risk. Typically, it takes on average between 8 and 12+ years to take a concept and develop it into a marketable product and more than $50M in development costs. One of the primary reasons for the long time and high cost of micro- and nano-device development is the inability for developers to design devices with knowledge of the material properties. This would be analogous to a civil engineer having to design a skyscraper without knowing the properties of the materials to be used in the building's construction. This is the problem currently faced by micro- and nano-device designers and developers.

Figure 2:
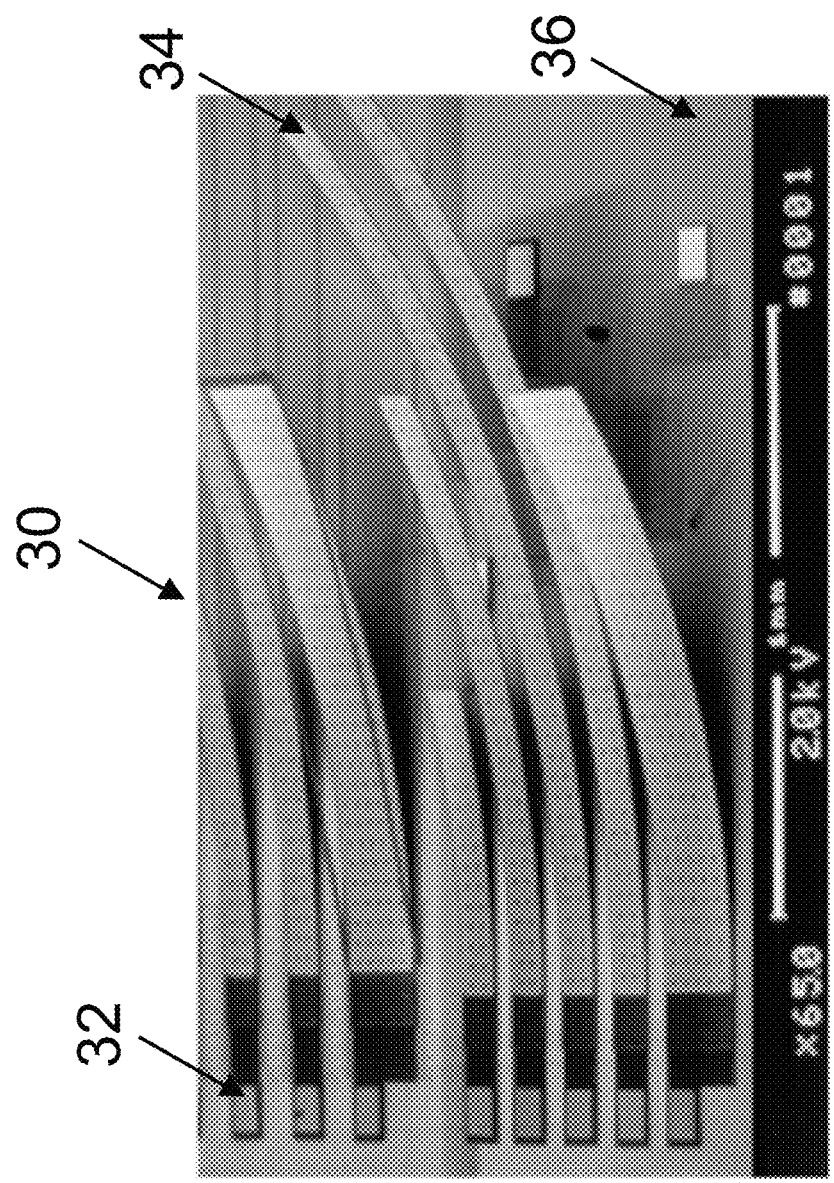
FIG. 2 is a photograph of some MEMS surface micromachined cantilevers, in which there is a stress gradient in the structural layer, as exhibited by the upward curling of the cantilever beam ends.

For example, FIG. 2 shows a photograph of some cantilevers fabricated on a substrate surface 30 using a process technology called "surface micromachining." This process technology entails the deposition of a thin film layer of a material that acts as a sacrificial layer. In the case, of FIG. 2, the sacrificial layer is a layer of silicon dioxide (SiO2). Subsequently, a structural or mechanical layer, which in this example is composed of polycrystalline silicon, is deposited as a thin film over the sacrificial layer. The structural layer then has photolithography and etching performed on it to pattern it into the desired shapes, which in this example are cantilevers 34 that are attached to the substrate at one end 32. Subsequently, the sacrificial layer is removed thereby releasing the structural layer from attachment to the substrate except only at the attachment point 32, which in FIG. 2 is at the left end of the cantilevers. The cantilevers 34 shown in FIG. 2 all have a curvature to them, whereby the right end lifts up from the substrate surface 36. This curvature is due to stresses in the structural material layer and these stresses are often very undesirable for device design.

Not knowing the material properties is obviously very problematic for device development. However, it also has serious repercussions for the deployment of micro- and nano-devices in real world applications. No matter that the intended application is for a thin film, when uncontrolled stress is present, it can cause a wide spectrum of problems and failures in the devices. Stress in thin films is invariably the leading source of device failure. Cracking, due to both tensile and compressive stress, is the major cause of these failures and is a problem found in every technique of physical vapor deposition (PVD). Of the most common PVD techniques, evaporation and sputtering can both suffer stress-related failures thin films deposited by these techniques, though they almost always differ in the inherent nature of the stress forces. Moreover, the reduction or elimination of a thin film's capacity to conduct electricity, elastically support a load, protect against corrosion, reflect or transmit light, a crack locally impairs a micro- or nano-devices' ability to function as designed. Additionally, once a crack forms, it often propagates, eventually resulting in a device becoming non-functional. Obviously, this has serious implications concerning device reliability. Therefore, it is critically important that material properties for micro- and nano-device development are better understood and methods for depositing thin film layers with known and controlled properties be developed and made available to device designers and developers.

Figure 3:
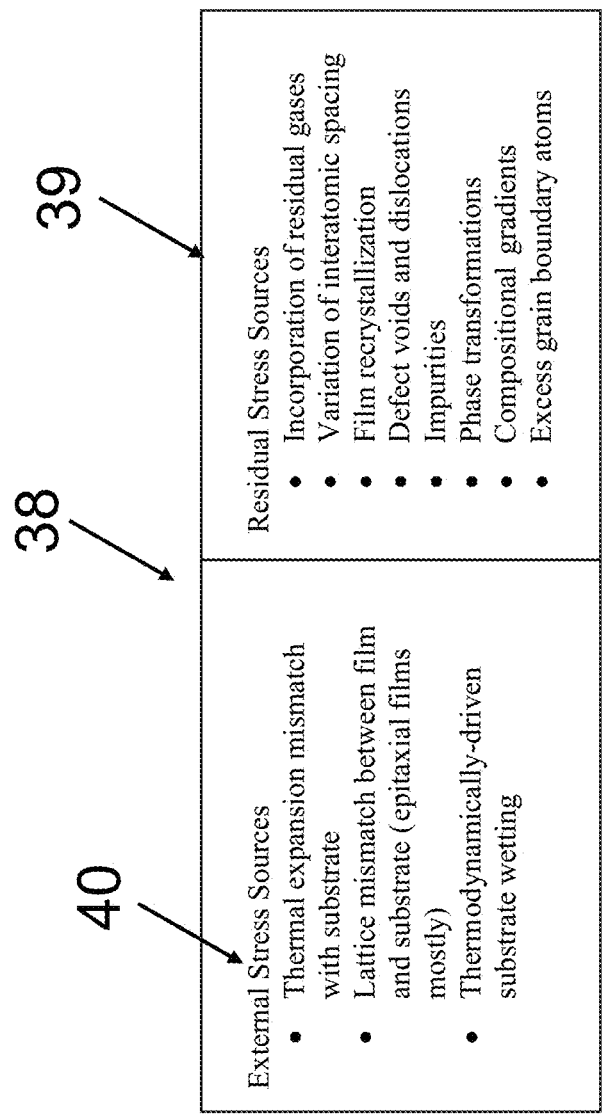
FIG. 3 is a table of the causes or sources of both external stresses and residual stresses in deposited thin films.

In considering the sources and causes of stress in thin films, the average stress in a thin film can be either zero, tensile, or compressive and with a magnitude over a very large range. The source of the stress found in thin films can originate from residual (internal) as well as result from external causes. The table 38 shown in FIG. 3 summarizes the leading sources of stress, both residual 39 and external 40. By definition, residual stresses 39 are the stresses that remain in a material after the original causes of the stresses (external forces 40, heat gradient) have been removed. These residual stresses 39 remain along a cross section of the material component, even without the external cause. Residual stresses 39 occur for a variety of reasons, including inelastic deformations and heat treatment. On a size scale equal to the thin film thickness, virtually any thin film deposited on a substrate possesses some state of stress distribution.

External sources 40 are dominated by the thermal expansion mismatch between the substrate and film material. Further compounding this stress source is the fact that the same material can have varying thermal expansion based upon its structure. Remarkably, this can even make the deposition of a thin film upon a substrate of the same material problematic.

Lattice mismatch and thermodynamically-driven wetting are similar in that they affect the structure and stress-state at the substrate-film interface. A stress field is generated by a lattice mismatch (either tensile or compressive) and is mostly found in epitaxial film growth, conditions not readily found in common PVD techniques, such as sputtering or evaporation. To a greater degree, varying levels of stress are formed by interfacial forces, which depend on the chemical free-energy change per unit volume that drives the condensation reaction, and, will determine film structure at the interface. When interfacial forces make film wetting of a substrate favorable, a high nucleation rate encourages a fine-grained or amorphous structure and is associated with tensile stresses due to the large grain boundary surface area. Conversely, a coarse-grained structure develops from the low nucleation rate found when wetting is not favorable and produces a weak substrate-film interface in addition to compressive stresses from more than usual film densification. While the stress fields from lattice mismatch and structural effects from film wetting are present at the substrate-film interface, they do not propagate far into the thin film. The wetting behavior is important with respect to the overall film adhesion since this stress source can lead to defected and weak substrate-film interfaces.

Figure 4:
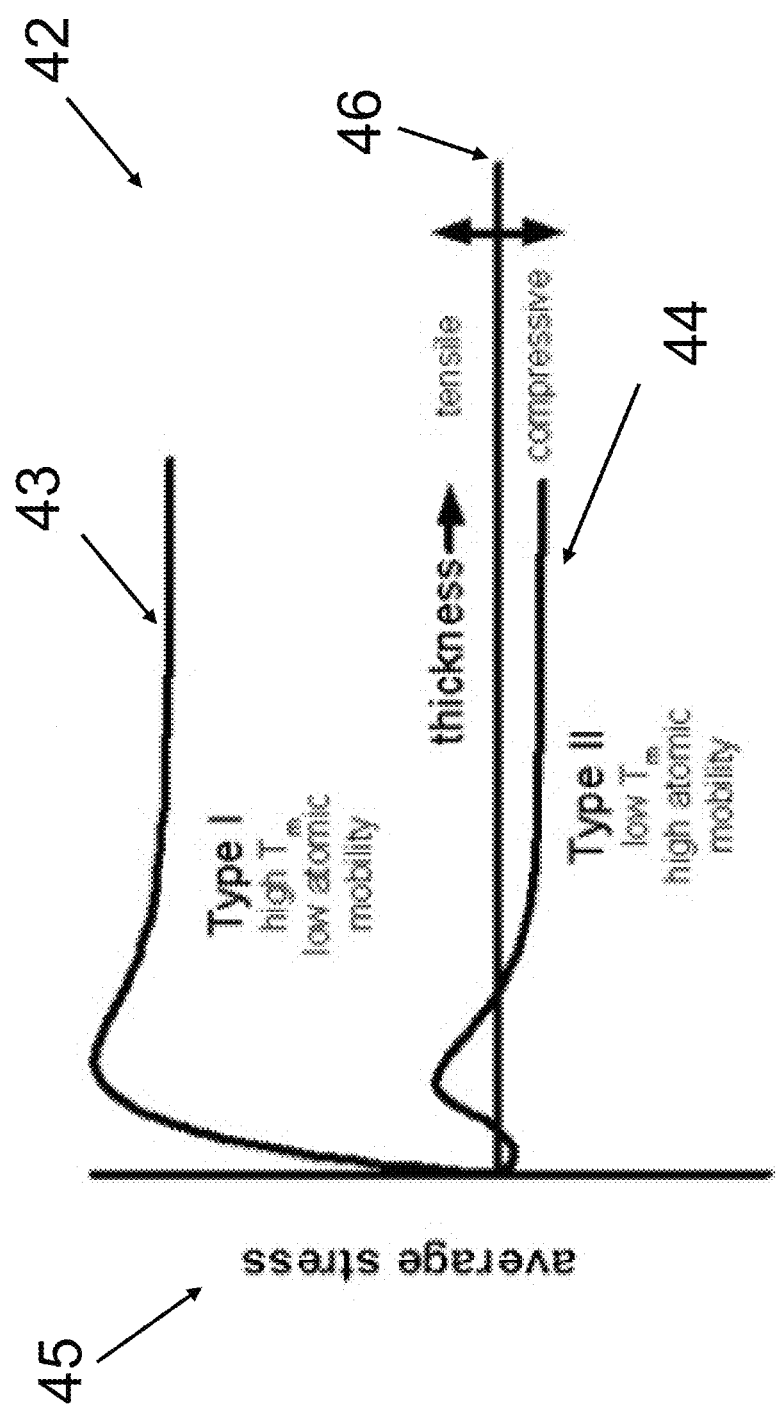
FIG. 4 is a plot of the average stress in a thin film as a function of the thickness of the thin film for both high and low mobility material and deposition conditions.

The common thread found with the sources of internal stress listed in the table 38 of FIG. 3 is the drive to reduce free energy, AG. The particular thin film material's ability to reduce AG resides with its characteristic adatom mobility, which is dependent on material and amount of energy supplied to the growing film by the deposition method. The two ends of the mobility spectrum are classified as Type I, shown as curve 43 in FIG. 4, and Type II, shown as curve 44 in FIG. 4, whose characteristic average stresses, plotted on y-axis 45, are illustrated in the graph 42 shown in FIG. 4 as a function of film thickness, plotted on the x-axis 46. Evaporated films are typically Type I, corresponding to low mobility conditions and have associated tensile stresses. Where more energy is put into the growing film, Type II possesses enough energy for adatom surface diffusion to occur, and leads to compressive stresses primarily due to excess atoms in the grain boundaries. Ultimately, the average stress approaches a steady value for a fixed deposition rate of a given material system, as shown in the graph 42 of FIG. 4.

Figure 5:
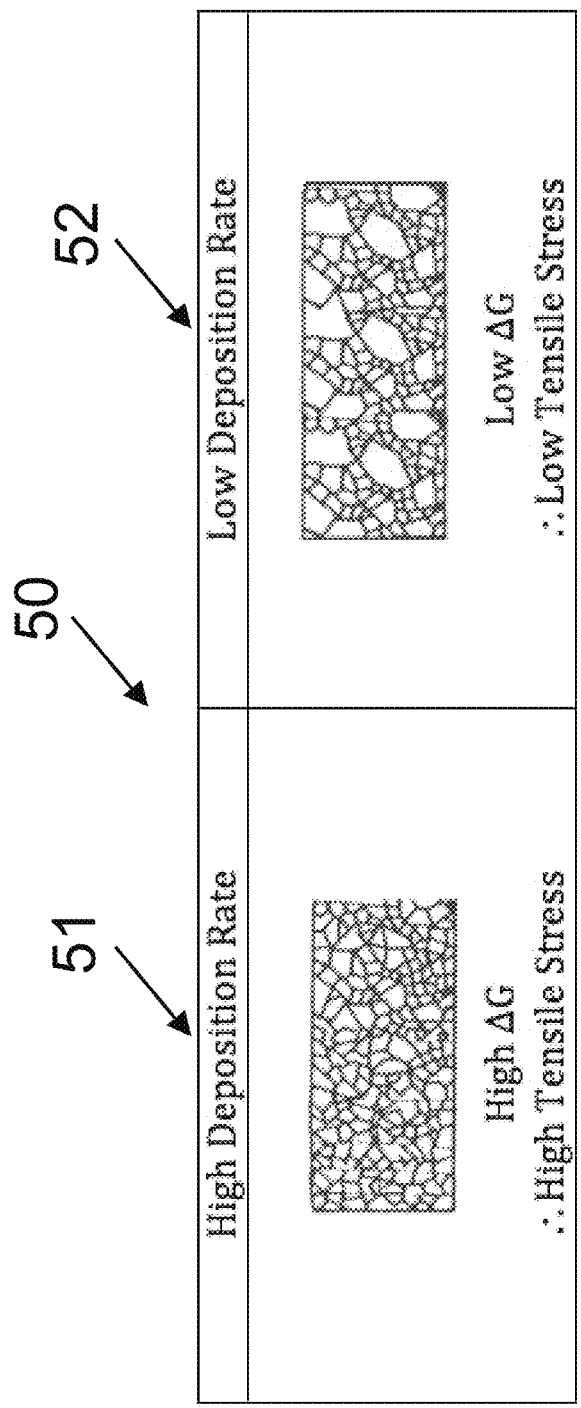
FIG. 5 is a table of thin film cross sections showing the resulting grain structure from both high and low deposition rates with accompanying free-energy □G.

Type I tensile stress curve 43 arises from the formation of low mobility defects and either a large amount of grain boundary area or completely amorphous structure. At the initiation of film deposition, a high deposition rate mutes the nucleation and cluster growth, resulting in smaller, more densely populated film material nuclei on the substrate surface. The largely unordered film structure at the substrate interface leads to tensile forces stemming from larger than equilibrium interatomic spacings as the material "pulls" in on itself in an attempt to reduce the free energy of the system. Also occurring at high deposition rates, as shown in illustration 51 on the left side in the chart 50 of FIG. 5, the crystal grains (if not completely amorphous) are small owing to lack of energy and time needed for adatom surface and lattice diffusion to sufficiently grow the grains and lead to a large grain boundary surface area contained in the thin film. Grain boundary surface reduction mechanisms act across and "close" grain boundaries widths less than 1.7 Å and, again, "pull" the film in on itself and exhibit attractive (tensile) forces that are felt over grain boundary widths greater than 1.7 Å. Nuclei that form at the substrate surface tend to be larger and sparser due to coalescence, which results in less grain boundary surface area and, accordingly, less tensile stress as shown in illustration 52 on the right side of FIG. 5.

The pressure at which film deposition occurs determines the stress of the growing film by increasing or decreasing the amount of kinetic energy imparted to it. Evaporated thin films typically operate at deposition pressures, P, in the $1\times10^{-4}$ Pa ($1\times10^{-6}$ Torr) range. Using an inert gas to increase P also increases the frequency of gas phase collisions, reducing the kinetic energy of the arriving molecules at the growing film surface. Using the mean distance traveled by molecules between successive collisions, the mean free path $\lambda_{mfp}$, as calculated by $$\lambda = \frac{RT}{\sqrt{2}\pi d^2 N_A P}$$

can predict the number of collisions that occur on average as the evaporated material moves from the source to the substrate. A high P increases the number of collisions, which results in defects and film structures that generate tensile stress. Low enough pressures at which zero collisions occur transfer the most kinetic energy and reduce the frequency and magnitude of tensile stress sources.

Figure 6:
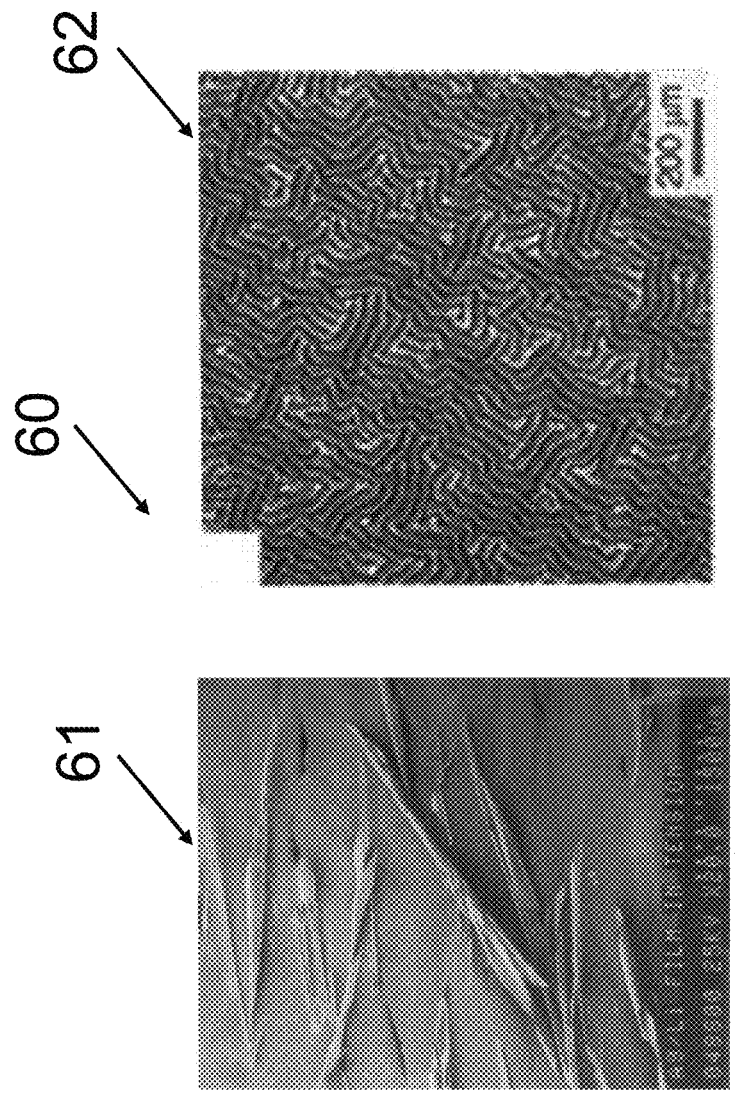
FIG. 6 is Scanning Electron Microscope (SEM) images displaying examples of thin film failure for tensile cracking on the left and compressive delamination on the right.

Excessive stress levels in thin films often result in failure. The photographs 60 of FIG. 6 show examples of both tensile 61 and compressive thin film 62 failure. Of the two commonly used PVD techniques, sputtering typically produces thin films with compressive stresses, while evaporation usually results in tensile thin film stresses. If a large enough compressive stress is present, it can cause cracking from buckling or "bubbling" of the thin film and is a result of the thin film pushing outwards, but being restrained by the substrate as shown in photograph 62 of FIG. 6. Tensile stresses lead to the film pulling in on itself, translating into the formation of cracks at defect sites or substrate cracking near the coating and the opening of these cracks, which results in further propagation as shown in photograph 61 of FIG. 6.

The fracture mechanics of thin films are often significantly different from bulk material behavior. The crucial factors that determine the type of failure depend on the thin film material, thickness, deposition parameters, and post-deposition treatment and aging. When the thin film consists of multiple layers, the number of parameters significantly increases, as does the complexity of the material interactions. Importantly, thin film failure occurs when it is energetically favorable for it to relax strain energy through plastic deformation (i.e. crack formation and/or delamination).

The adatom surface diffusion, desorption, and atomic bulk diffusion are processes that possess diffusion and sublimation activation energies. The activation energies scale with the relationship of the particular material's melting temperature. Therefore the most commonly used solution to the problem of non-equilibrium structures that cause stress in thin films is to perform thermal annealing. Therefore, high temperature thermal anneals is something that is routinely performed in micro- and nano-fabrication for many of the commonly used deposited materials (e.g., polycrystalline silicon); but this approach has significant limitations and disadvantages. One major limitation is that most materials have very high melting temperatures, which rule out thermal annealing to minimize film stress or eliminate film stress in a large number of commonly used materials in micro- and nano-fabrication (at least at reasonable temperatures). Additionally, thermal annealing as a method of stress management is not a viable option for the process sequences of many MEMS devices due to the fact that it alters and/or degrades other pre-existing materials on the substrate, as well as the resultant performance of the devices. Additionally, thermal anneals are not desirable, since they require an additional processing step after every deposition, thereby increasing the cycle time and cost of MEMS fabrication. What is needed is a method and system by which thin films can be deposited at lower temperatures without the need for a thermal anneal and where the stress of the thin film can be tailored to a desired and pre-determined value, either compressive, tensile, or zero state of stress.

The method of the present invention is applicable to any physical vapor deposition (PVD) process technology, including evaporation and sputtering.

Figure 7:
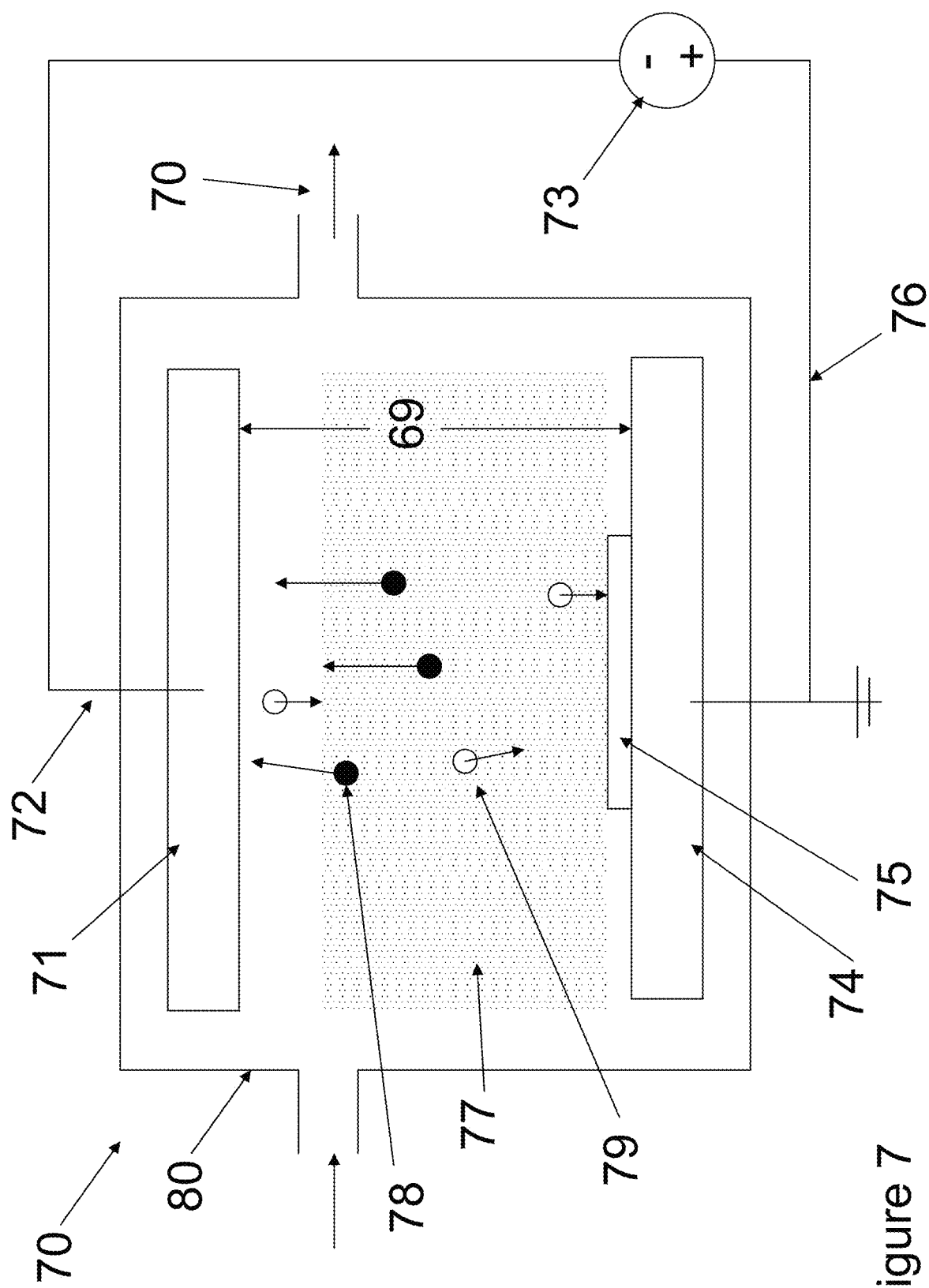
FIG. 7 is an illustration of a conventional sputter deposition system used for thin film sputter deposited PVD.

FIG. 7 illustrates a typical sputtering system 70 used for depositing thin films using this technique. The sputtering process takes place in a vacuum enclosure 80 with an input gas line 78 that feeds an inert gas, such as Argon, into the chamber 80. Vacuum is drawn in the chamber 80 through the connection 70 that is connected to a vacuum pump (not shown). A target 71 composed of the material to be deposited is affixed inside the chamber 80 and connected 72 to a power supply 73 wherein the negative potential is established in the target 71, which acts as a cathode. An anode 74 is located within a distance from the cathode 71 inside the chamber 80 and connected through an electrical connection 76 to the anode 74 and the positive side of the power supply 73. A substrate 75 is placed onto the anode 74. The inert gas stream incoming through the input port 78 into the chamber 80 is ionized and forms a plasma 77 between the anode 74 and cathode 71. Inert ions from the plasma 78 are accelerated toward the cathode 71 and impinge the cathode 71 and target material of the cathode with high energy, which results in target material 79 being ejected from the target 71 toward the substrate 75, thereby resulting in the deposition of a thin film of the target material 71 onto the substrate 75.

Figure 8:
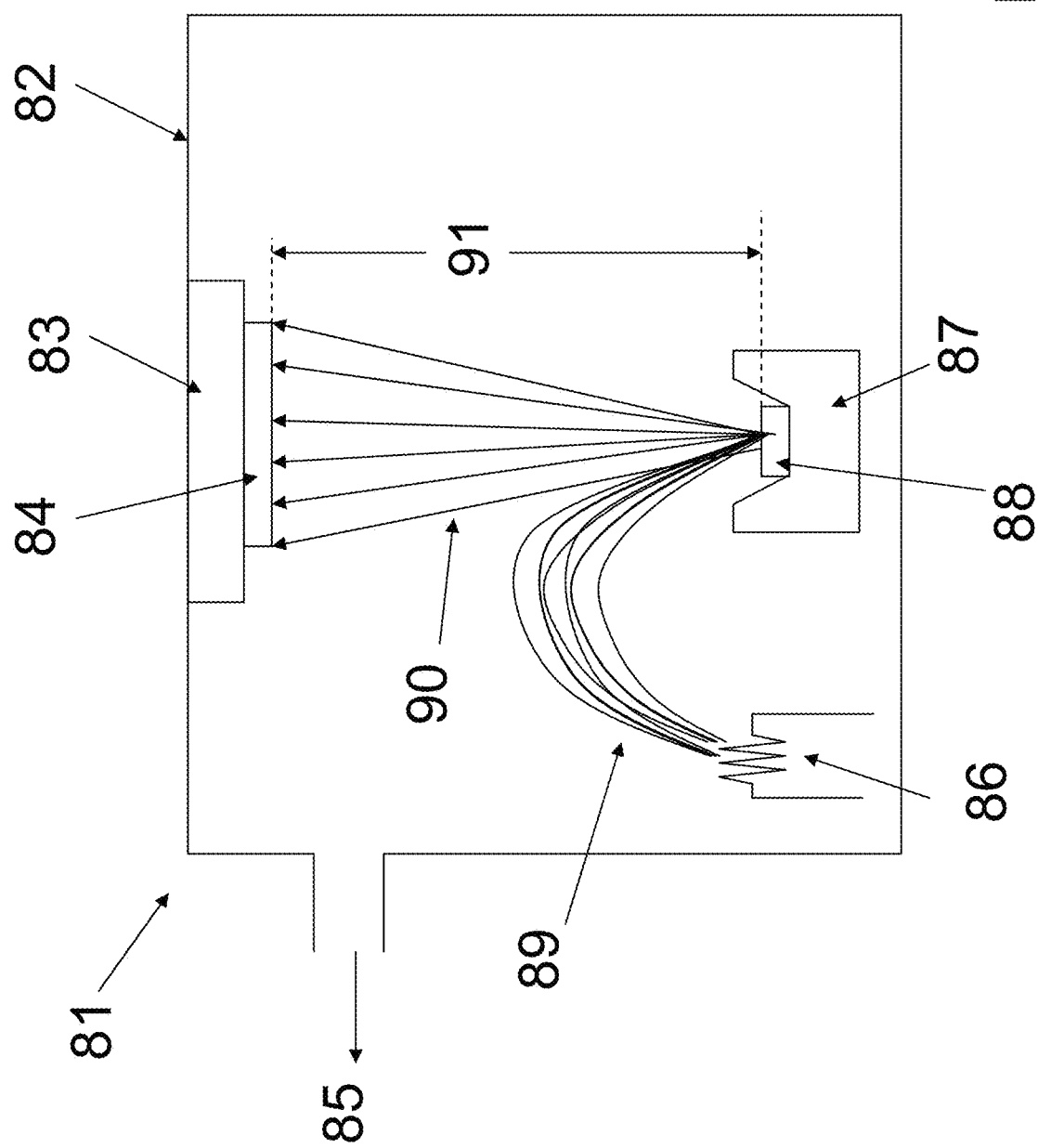
FIG. 8 is an illustration of a conventional evaporative deposition system used for thin film evaporative deposited PVD.

FIG. 8 illustrates a typical evaporation system 81 used for depositing thin films using this technique. The evaporation deposition process takes place in a vacuum enclosure 82 and vacuum is drawn in the chamber 82 using the connection 85 that is connected to a vacuum pump (not shown). A crucible 87 located in the chamber 82 contains a material 88 composed of the material to be deposited. An electron beam 89 is generated via an electron beam source 86, which is steered toward the target material 88 in the crucible 87 by the voltage potential on the crucible 87 (not shown). The impinging electron beam 89 onto the target material 88 in the crucible 87 causes the target material 88 to heat up and melt, and thereby vaporize or evaporate and result in the target material 88 phase changing into a gas phase 90, which is deposited onto a substrate 84 as a thin film. The substrate 84 onto which the target materials is deposited is positioned onto a holder 83 inside the chamber 82, which is under vacuum pressure 85.

The method and system of the present invention of controlling the stress state in a thin film involves varying four process parameters during deposition. These are: deposition rate; process pressure; process temperature; and ion bombardment. These can be varied individually or in combination to obtain a pre-determined stress state in deposited thin films under the present invention.

The first method for controlling the stress is by varying the deposition rate. Through standard deposition rate controlled thin film growth, the rate of nucleation is altered. By lowering the deposition rate, energy is neither added nor removed from the growing film surface, as compared to higher deposition rates. The only factor that changes is the time that adatoms can diffuse to low energy sites before being covered and frozen in place by newly condensing material.

By altering the deposition rate, a degree of control is obtained over the residual stress. Aside from film stress, there are other effects that result from varying the deposition rate, such as substrate heating due to the cumulative duration of radiant source exposure and tool cost associated with time spent on thin film fabrication, both of which will be reduced for higher deposition rates. The deposition rate in a sputtering system, such as sputtering system 70 shown in FIG. 7, is generally varied by adjusting the voltage potential produced by a power supply, such as power supply 73 shown in FIG. 7. A higher voltage potential will result in a higher deposition rate and vice versa. The deposition rate in an evaporation system such as evaporation system 81 shown in FIG. 8, is generally varied by adjusting the electron beam current associated with an electron beam, such as electron beam 89 shown in FIG. 8, which is generated by electron beam source 86. A higher electron beam current will result in a higher deposition rate and vice versa.

Controlling thin film stress in deposited material layers by adjustment of the deposition rate can be done with any means of physical vapor deposition, including evaporation and sputtering.

A second method for controlling the stress is by varying the process pressure. The mean-free path, $\lambda_{mfp}$, used in combination with the source-substrate distance, $D_{ss}$, shown as item 69 in sputtering system 70 of FIG. 7 and as item 91 in evaporation system 81 of FIG. 8, provides a route to design zero or multiple collisions and engineer the degree of thermalization, which directly affects the amount of energy supplied to the adatoms at the film surface. By increasing the pressure P, such that $D_{ss} > \lambda_{mfp}$ not only reduces the kinetic energy transferred to the film, but also increases the degree of conformality obtained across substrate topography. Decreasing P so $D_{ss} < \lambda_{mfp}$ ensures the maximal kinetic energy is transferred and the deposition is line-of-sight from the target to the substrate. However, if kinetic energy is supplied to control stress by some other means, a high P can be used solely to introduce conformality to an evaporated film.

If a reactive gas, such as oxygen or nitrogen, as opposed to an inert gas, is used to backfill a chamber during deposition and increase P, some degree of stoichiometric control can also be introduced. Typically, deposited oxides are oxygen deficient due to oxygen loss to the chamber pumping system when evaporating an oxide source material or insufficient oxygen uptake when evaporating reactively from an elemental source material. By providing oxygen impingement at the growing film surface, an oxide thin film will be closer to stoichiometric with regard to oxygen content.

The third method of controlling stress in PVD deposited thin films is by varying the temperature. Typically, this is done using substrate heating or cooling, wherein the substrate that has the thin film deposited on the surface is located onto a chuck inside the deposition system and the chuck is heated or cooled using any number of means, including: heater coils; heating lamps; RF induction heating coils; temperature controlled fluids that run through the chuck; etc. In general, the higher the temperature, the more energy is available to the adatoms to find a lower energy state and thereby lower the stress levels.

A fourth and the most flexible method for controlling the stress is by using ion-assisted deposition (IAD). Ion-Assisted Deposition provides the most latitude and design freedom for controlling stress in deposited films. The basic concept is that an ion beam is directed toward the substrate surface during the deposition process of a thin film layer, wherein the energy of the impinging ions is able to modify the energy and thereby the stress in the layer during deposition.

Two main types of ion sources can be embodied and are categorized into gridded ion sources and gridless ion sources with either the end-Hall and anode-layer configuration.

Figure 9:
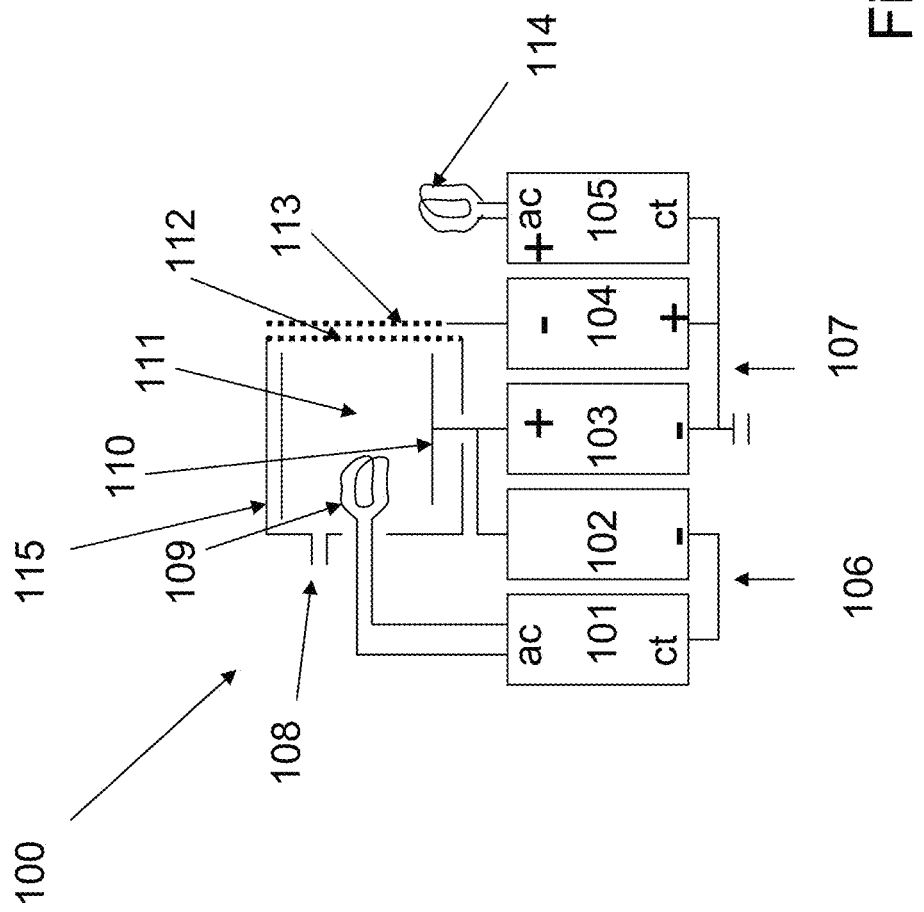
FIG. 9 is a schematic of a gridded ion source used for ion-assisted thin film deposition that allows stress control in the deposited thin films.

The preferred embodiment of a gridded ion source 100 is illustrated in FIG. 9. Gridded ion source 100 operates by generating ions in a circular or elongated DC-discharge chamber 115. Several types of electron-emitting cathodes 109 can be used, including hot-filament and hollow-cathode. The electron-emitting cathode 109 is connected to a cathode power supply 101 where an electrical connection 106 is made between the cathode supply 101 and the negative terminal on the discharge supply 102. The positive potential side of the discharge supply 102 is electrically connected to the anode 110 inside the chamber 115. The positive side of the discharge supply 102 is also electrically connected to the positive potential side of the beam supply 103, whose negative electrical potential side is connected by a common connection 107 to the accelerator supply 104 and the neutralizer supply 105. The positive voltage potential side of the beam supply 103 is electrically connected to the anode 110. The negative potential side of the accelerator supply 104 is connected to the ion accelerator 113. The neutralizer supply 105 is electrically connected on the ac side to a neutralizer coil 114. It should be noted that the ions can also be generated with a radio-frequency (RF)-discharge, which requires no electron emitting cathode (not shown). The discharge chamber 115 is maintained at a positive potential that accelerates the ions in conjunction with and through apertures called ion optics. The ion optics are typically composed of two perforated grids, shown as screens 112 and 113 in FIG. 9, that can create ion beams with energies of more than 200-300 eV. A three-grid ion optics preferred embodiment (not shown) consists of three perforated grids. These systems provide a smaller divergence of ion beams with energy up to ~500 eV and decreases beam contamination resulting from sputtering of the accelerating grid by charge-exchange ions. Preferably, ion optics are employed to focus the beam to converge, collimate, or diverge, depending on how the grid's are powered.

Figure 10:
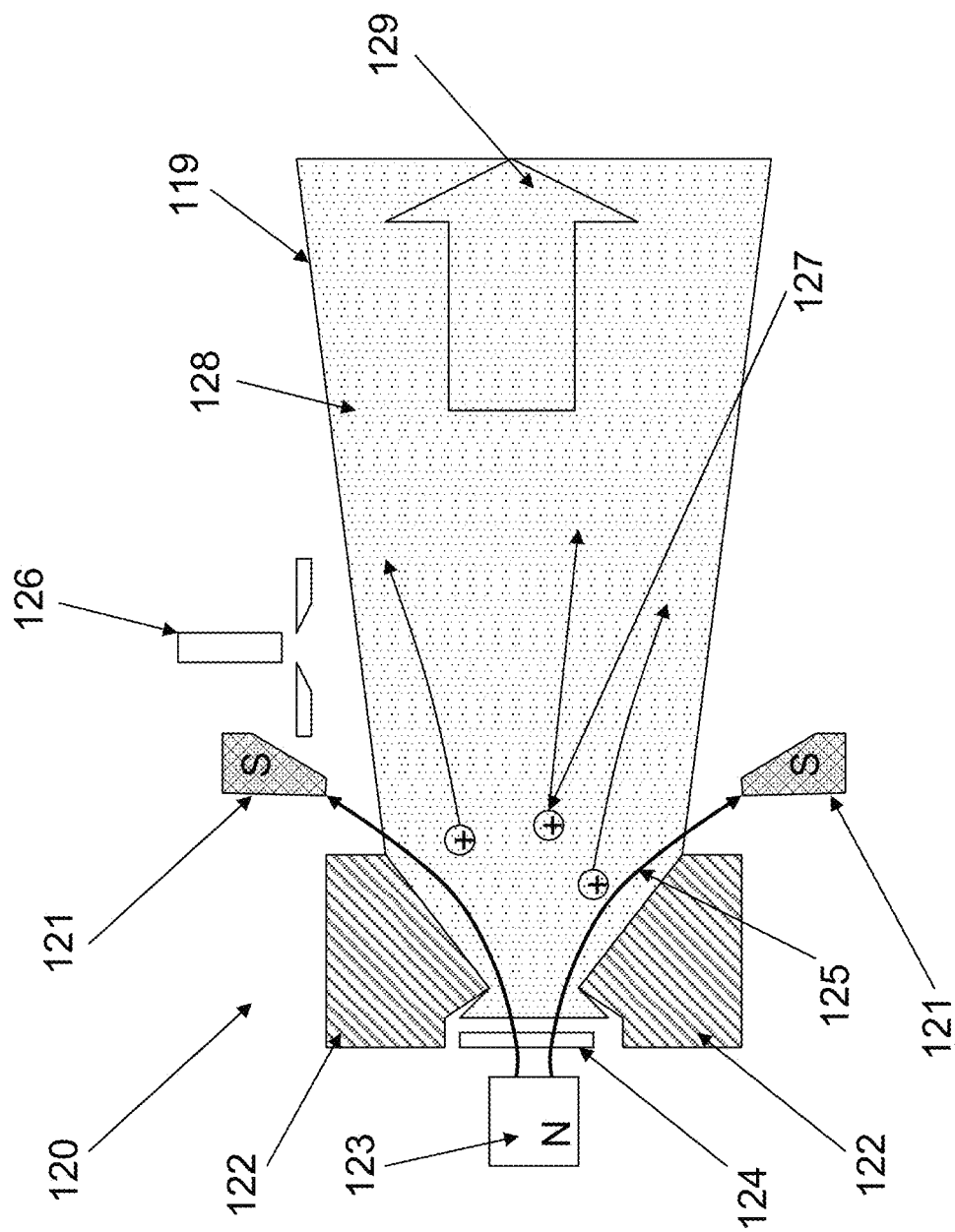
FIG. 10 is a schematic of a gridless end-Hall ion source used for ion-assisted thin film deposition that allows stress control in the deposited thin films.

The preferred embodiment for a gridless ion source can be either an end-Hall or anode-layer gridless source. The ions in a gridless source are generated by a discharge supply, with an accelerating potential difference produced by electrons from the cathode-neutralizer entering the magnetic field setup by permanent magnets in the source. The end-Hall ion source type 120 shown in FIG. 10 has a discharge chamber 119 where acceleration of ions takes place in a quasi-neutral plasma 128, with approximately equal densities of electrons and ions. Consequently, there is no limitation on ion-beam current and the ion beam equals about 20-30% of the discharge current and the mean ion energy corresponds to about 60-70% of the discharge voltage. An end-Hall ion source 120 operates at a process pressure of 1 mTorr or less and has an end-hall anode 122 and an electron source cathode 126. Magnetic field lines 125 are established between the north side 123 and the south side 121 of a magnetic or electro-magnet. The gas to be ionized is input at 124 and ions 127 are generated in the chamber 119 to form a plasma 128 and a ion beam 129. This configuration of ion source can generate large ion-beam currents at ion energies in the 100-300 eV range, but cannot easily generate higher ion energies. The ion-beam profile is limited to a divergent shape, as shown in FIG. 10.

An anode-layer ion source (not shown) is also known as a closed-drift ion source, which refers to the electron's movement in a closed path around an annular- or "racetrack"-shaped discharge chamber. The anode-layer is a type of closed-drift source in which most of the acceleration takes place in a thin layer near the anode. The anode-layer type typically operates in the vacuum mode, characterized by the absence of a cathode neutralizer. The discharge voltage ranges from about 800-2000 V, noticeably higher than for an end-Hall ion source 120. This type of ion source operates at a background pressure of several mTorr or less. One major drawback originates from the fact that the ion beam potential must be elevated to obtain neutralizing electrons from the surroundings. This exposes the substrate to damaging high electric fields and high potentials for dielectric substrates or substrates with dielectric films.

Figure 11:
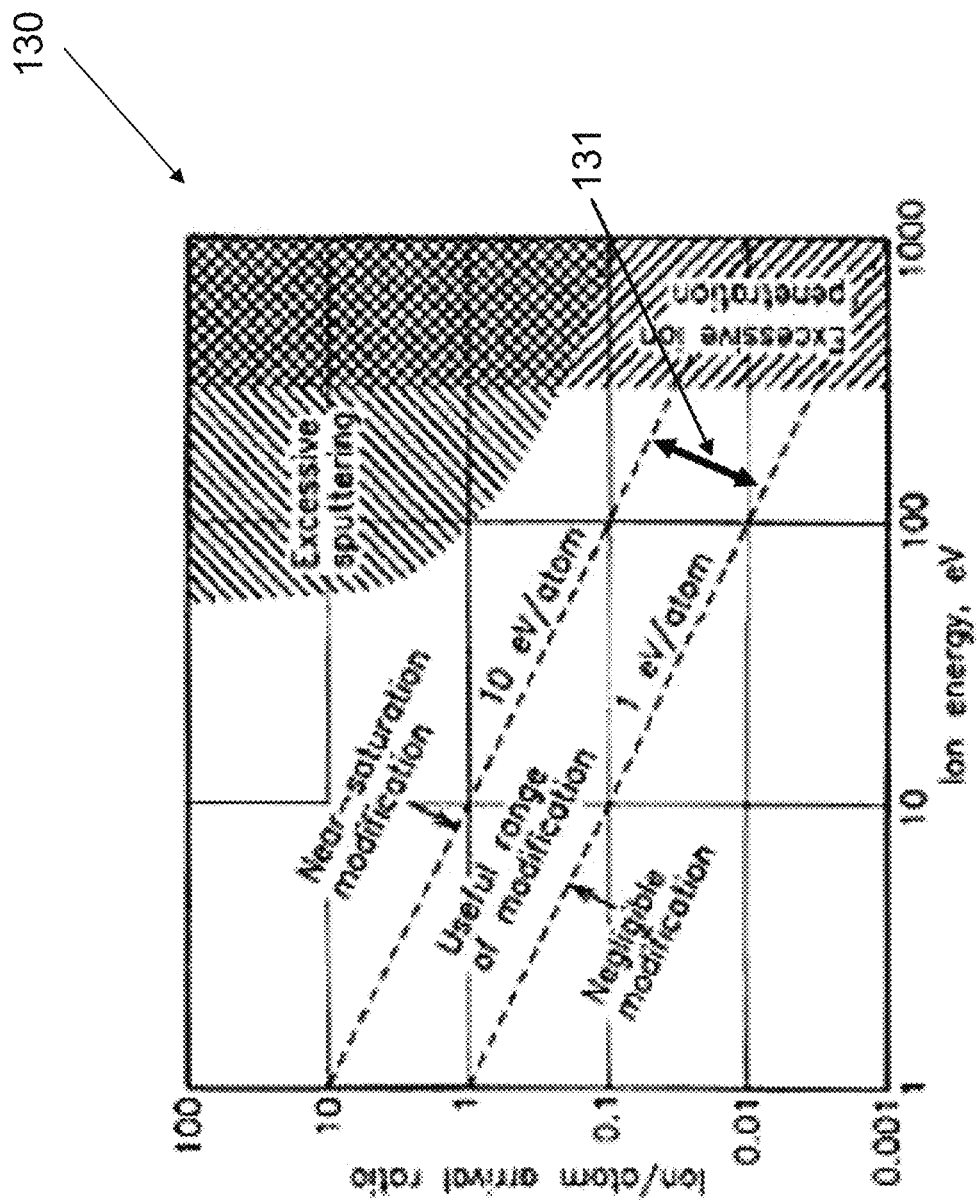
FIG. 11 is a plot of the necessary ion energy dose for thin film stress modification and control.

The ion source must be able to deliver the required level of ion beam current density at the substrate, which roughly equates to an arrival rate of one ion per atom of deposited material. Hence, the higher the deposition rate, the greater the ion current density required. However, the high ion current density also needs to be delivered at sufficiently low ion energies, since many materials will start to sputter (including chamber surfaces) as the ion energy approaches and exceeds 100 eV. This creates a potential contamination risk to the deposited film due to redeposition of back sputtered chamber components. For sufficiently high deposition rates, only the gridless end-Hall ion sources can put out the necessary combination of high ion current density and low ion energy required for film stress control. Kaufman and Harper identified a region between 1-10 eV/atom necessary for measurable control as seen in chart 130 of FIG. 11, wherein the range between 1 and 10 eV/atom 131 is shown on the chart 130. At low deposition rates, the gridded ion source is best fitted to control film stress, since the ion energy distribution is much narrower than found in gridless ion sources. Additionally, gridded ion sources can focus the beam, whereas gridless source beam's are solely divergent.

The addition of energy from bombarding atoms in the form of a beam of inert or reactive species can provide sufficient energy to adatoms to overcome the activation energy barriers to low energy sites. As the adatoms are able to diffuse into low energy sites, the residual stress moves initially from tension to compression (FIG. 4) for evaporated films. Care must be taken not to supply too much energy, such that the stress is pushed into compressive region. Fortunately, the amount of ion energy coming from an ion source can be designed to provide a specific level of energy that brings the average stress in the film to near-zero. Widening the process window further, use of inert gases in the ion source, such as helium, neon, argon, and xenon, have the ability to transfer differing amounts of energy to the growing film, while not contaminating the material. By varying the mass of the bombarding inert gas, the fraction of kinetic energy transferred between the inert gas ($m_2$) and the film ($m_1$) varies and is determined by $$\frac{KE_i - KE_f}{KE_i} = \frac{m_2}{m_1 + m_2}$$

Therefore, after consideration of the atomic mass of the thin film material(s), a corresponding inert gas, such as argon, is selected to provide a desired level of kinetic energy transfer to achieve specific atomic, nano-, microstructure at a particular pre-determined residual stress level.

The methods of the present invention of controlling the stress state in a thin film to a pre-determined near-zero value by varying one or more of the three important process parameters during deposition will now be described.

Varying the Pressure and Temperature of the PVD Process to Control Stress in Thin Films:

When stress in thin films is present and causes the intended behavior of a thin film to change, the systematic process of the present invention can be used to minimize the stress. The first two PVD variables that can be used to alter the stress in thin films are process pressure and substrate temperature and the methodology to arrive at a desired pre-determined stress level by varying only the temperature and/or pressure is outlined in the flow chart 140 of FIG. 12.

The changes in film stress when adjusting these PVD process variables also change the thin film morphology and conformality over the topology of the substrate. The thin film structure can change dramatically over the nano-, micro-, and macroscale by becoming more or less porous and crystalline. The conformality can change from line-of-sight to partially conformal while complete conformality is never possible in either evaporation or sputtering PVD techniques.

When thin film stress needs to be adjusted to return desired functionality to the thin film, the widest process window variable is the process pressure. The determination of whether the initial process pressure is "high" or "low" can be found by comparing two deposition tool parameters: the deposition material source to substrate distance ($D_{ss}$) and the mean free path of the gas-phase depositing material ($\lambda_{mfp}$). A pronounced affect on the thin film stress and conformality occurs when moving the $\lambda_{mfp}$ above or below the $D_{ss}$.

In the case where the thin film stress adjustment increases the tensile nature of the stress, the process pressure will be increased and is represented by moving toward or further into the $\lambda_{mfp}<D_{ss}$ range. When increasing the compressive stress, a decrease of the process pressure will be needed and is represented by moving toward or further into the $\lambda_{mfp}>D_{ss}$ range. The typical process pressure range is from $10^{-9}$ to $10^{-3}$ Torr. If the process pressure adjustment is successful in moving the thin film stress to zero, then no further adjustment is necessary.

If the process pressure window is not large enough and stress is still present or if the accompanying thin film morphology and/or conformality changes are not tolerable, the second of the PVD process variables can be adjusted. The sensitivity of thin film stress to substrate temperature is not as large as it is to process pressure, but there is still a large enough process window to change the film stress to a zero-point. Typical PVD depositions occur at room temperature (20° C.) and a realistic range extends from −100° C. to 800° C.

In the case where the thin film stress adjustment increases the tensile nature of the stress, the substrate temperature will be decreased (<20° C.). When increasing the compressive stress, the substrate temperature will be increased (>20° C.).

As with process pressure, the thin film morphology and conformality will be altered as the temperature changes. If the desired functionality of the thin film can be retained while an adjusted substrate temperature is used, then the realistic temperature range of −100° C. to 800° C. defines the process window for substrate temperature. Lower than room temperatures may be achieved through cooling of the substrate during deposition and is usually accomplished with liquid nitrogen or chilled water. Higher than room temperatures are achieved by heating the substrate with a resistive heater in contact with the substrate or by irradiation from a source (IR or visible wavelengths).

If the thin film and/or substrate cannot be adjusted for temperature and if the process pressure window could not adjust the thin film stress to a zero-point, then adjustment of the bombardment is necessary.

Therefore, using the flow chart 140 of FIG. 12, it can be seen that the first decision point 141 is whether a thin film is known or expected to have an excessive stress level. If the film does not, then the thin film can be deposited using the standard process parameters at steps 143. If the film does have excessive stress, then the next decision point 142 is whether the film morphology and/or conformality are important. If thin film morphology and/or conformality are important, then the next decision point 144 is whether adjusting the deposition pressure will change film morphology and/or conformality to an undesired level. If the answer to this decision point 144 is no, then the deposition pressure can be adjusted over the range from $10^{-3}$ to $10^{-9}$ torr to obtain the desired thin film stress level. If on the other hand at decision point 142, wherein the morphology and/or conformality are not important, the next decision point 145 is whether the stress can be controlled within the process pressure window. If it can, then the pressure is adjusted accordingly in step 146 over the range from $10^{-3}$ to $10^{-9}$ torr to the desired stress level.

If not, then a decision point 147 is used to determine whether a higher or lower substrate temperature during deposition can be used, wherein the lower temperature may be below 0 degrees C. and the higher temperature may be greater than 250 degrees C. If substrate temperature cannot be used, then the pressure and temperature are fixed and ion bombardment is used to control the stress level 148 (see below for how this method is performed). If the substrate temperature can be adjusted, the next decision point 149 is whether adjusting the substrate temperature will cause the thin film morphology and/or conformality to an undesired state or not. If the answer to this decision point 149 is yes, then ion bombardment must be used to control the stress level 148 (see below for how this method is performed). If the answer to this decision point 149 is no, then the next decision point 150 is if increasing the tensile stress by decreasing the substrate temperature or increasing the compressive stress by increasing the substrate temperature enables a stress within the temperature process window to be obtained or not. If not, then ion bombardment must be used to control the stress level 148 (see below for how this method is performed). If yes, then the substrate temperature is adjusted accordingly between the range from −100 C to +800 C at step 151.

The method of controlling stress in PVD deposited thin films described above can be used with either evaporation or sputtering means of deposition. If the method described above, wherein the pressure and temperature are varied, cannot be used to obtain the desired pre-determined stress level, then ion bombardment must be used and the methods of obtaining controlled stress in thin films is different for PVD deposition performed using evaporation and sputtering. These methods for controlling stress using ion bombardment are described below, first starting with evaporated PVD thin films and then sputtered PVD thin films.

Using Ion Bombardment to Control the Stress of Evaporated PVD Deposited Thin Films:

In the case where evaporation PVD process pressure ($10^{-9}$ to $10^{-3}$ Torr) and substrate temperature (−100° C. to 800° C.) have been explored and found not adequate in reducing the thin film stress as described in flow chart 140 of FIG. 12, adjustment of the bombardment from an ion source is necessary.

The ion source used in thin film stress modification are typically gridded or gridless ion sources of end-Hall Kaufmann, or anode-layer configurations as described above. The ion source variable parameter with the largest effect on film stress is the ion source current, which ranges from 1-12 A typically. The ion source current adjusts the dose of bombarding species onto the growing thin film. In the case where the thin film stress adjustment increases the tensile nature of the stress, the ion source current will be decreased (<2 A). When increasing the compressive stress, the ion source current will be increased (>2 A).

If the zero-point for the thin film stress falls outside the ion source current process window, the ion gun voltage provides an expansion to the overall process window for the ion source. The ion source voltage adjusts the energy with which the bombarding gas phase imparts to the growing thin film. In the case where the thin film stress adjustment increases the tensile nature of the stress, the ion source voltage will be decreased. This is typically <200 V but is heavily reliant on the type, size, and configuration of the particular ion source. When increasing the compressive stress, the ion source voltage will be increased to >200 V.

When the zero-point of the film stress cannot be dialed in using a fixed ion source current and variable ion source voltage, re-adjustment of the ion source current becomes necessary. An accompanying re-adjustment of the ion source voltage may be necessary to fine-tune the stress. Several iterations of this process may be necessary. If successful both the ion source current (1-12 A) and voltage (100-300 V) will be fixed and thin films of any thickness may be deposited at the zero-stress level. If unsuccessful, a re-adjustment of the process pressure and/or substrate temperature may be necessary since altering either of these process variables will shift the process window obtainable with the ion source. The adjustment process for the ion source current and voltage will begin anew at this point.

In the case where no set of evaporation process variables can be found that results in a zero-stress level, other PVD techniques must be explored.

The method of obtaining stress controlled evaporative PVD deposition of thin films is shown in the flow chart 160 of FIG. 13. The first decision point 161 is whether process pressure and temperature have been explored to control the stress. If the answer is no, then the next decision point 162 is whether the pressure can be varied from between $10^{-3}$ to $10^{-9}$ torr and the temperature varied between −100 C to 800 C to attempt to obtain the desired stress level in the deposited thin film. If the answer is yes, then the pressure and temperature can be varied accordingly to obtain the desired stress state in the thin film 163. If not, then ion bombardment during deposition must be explored thereby leading to the next decision point 164.

If on the other hand, pressure and temperature have been varied without the desired results, then the next decision point 164 is whether the stress in the thin film is within the ion gun current process window or not. If the answer is yes, then the gun acceleration voltage is fixed and the ion current is adjusted accordingly 165, typically between the range from 2 to 12 Amps. If the answer at decision point 164 is no, then proceed to the next decision point 166 wherein the question is whether the stress can be controlled by adjusting the voltage over the process window or not. If the answer is yes, then the ion gun current is fixed within the range from 2 to 12 Amps, and the ion gun acceleration voltage is adjusted accordingly 168 over the range from 100 to 300 Volts. If the answer at decision point 166 is no, then adjust and fix the ion gun acceleration voltage within the range from 100 to 300 Volts and proceed to decision point 164 thereby circling around the flow chart.

If the cycle of decision points, from 164 to 166 to 167 and back to 164 has been repeated several times and the stress cannot be controlled within the ion gun voltage process window at decision point 166, then proceed to decision point 169, wherein based on the fact that the ion gun current and voltage limits have been reached without obtaining the desired results, then the question is whether the temperature and pressure can be further adjusted accordingly or not. If the pressure and temperature can be further adjusted, then the pressure and temperature can be varied within the ranges of $10^{-3}$ to $10^{-9}$ torr and −100 C to 800 C, respectively and the process development cycles back to decision point 164 wherein the ion gun current is again adjusted to attempt to obtain the desired result. If the answer at decision point 169 is that no further adjustment of the pressure and temperature can be attempted, then it can be concluded that ion bombardment with evaporative PVD deposition will not allow the thin film stress to be controlled to the desired stress state 171.

Using Ion Bombardment to Control the Stress of Sputtered PVD Deposited Thin Films:

In the case where evaporation PVD process pressure ($10^{-9}$ to $10^{-3}$ Torr) and substrate temperature (−100° C. to 800° C.) have been explored and found not adequate in reducing the thin film stress, adjustment of the inherent bombardment from a sputter source is necessary and is described in flow chart of FIG. 14.

The largest process window achievable is found by adjusting the target sputter power density over the range from 2-10 W/cm$^2$. The target sputter power density controls many aspects of the sputter PVD process of which the most important is the energy of bombarding film material and sputter gas species. In the case where the thin film stress is desired to increase the tensile nature of the stress, the target sputter power density should be decreased. When it is desired to increase the compressive stress, the target sputter power density should be increased. If the target sputter power density adjustment is successful in producing a zero-stress level in the deposited thin film, fix all other process variables and use the adjusted target sputter power density accordingly, typically within the range of 2-10 W/cm$^2$ to obtain the desired stress state the deposited thin film.

In the case where the target sputter power density is not successful in shifting the thin film stress to zero, the sputter signal frequency may be used to expand the sputter deposition process window. The frequency range covers 0 to 13.56 MHz as allowed by the FCC. A frequency of 0 Hz corresponds to direct current (DC) sputtering while the range from >0 Hz to kHz frequencies corresponds to mid-Radio Frequency (mid-RF) or pulsed-DC sputtering and the MHz range frequencies correspond to RF sputtering. Adjustment of the sputter signal frequency changes the nature of the bombarding species at the growing thin film surface as the signal flips from positive to negative and back. With respect to sputter signal frequency, there is no standard adjustment direction to impart more or less energy, since the nature of the energy differs widely as the sputter source, material, and sputter gas chemistry varies. The stress-level effects of increasing or decreasing the sputter signal frequency must be understood before an adjustment direction can be identified. If the target sputter power density is fixed and the sputter signal frequency adjustment is successful in producing a zero-stress level in the deposited thin film, fix all other process variables (process pressure and substrate temperature) and use the adjusted sputter signal frequency accordingly (0-13.56 MHz).

The smallest process window adjustment resides with the sputter signal duty cycle, yet tuning the sputter signal duty cycle can be used in conjunction with the target sputter power density and sputter signal frequency to identify a zero-level thin film stress. The typical range for the sputter signal duty cycle is between 5 and 100%. A sputter signal duty cycle of 100% corresponds to using a DC sputter signal and <100% to pulsed-DC and RF sputter signals. The duty cycle changes the duration of the negative and positive portions of each cycle and thereby imparts varying levels of energy into the growing thin film surface. As with the sputter signal frequency, there is no standard adjustment direction to impart more or less energy since the nature of the energy differs widely as the sputter source, material, and sputter gas chemistry varies. The stress-level effects of increasing or decreasing the sputter signal duty cycle must be understood before an adjustment direction can be identified. If the sputter power density and sputter signal frequency are fixed and the sputter signal duty cycle adjustment is successful in producing a zero-stress level in the deposited thin film, fix all other process variables (process pressure and substrate temperature) and use the adjusted sputter signal duty cycle accordingly (5-100%).

While the process windows associated with sputter signal frequency and sputter signal duty cycle are smaller than that of the target sputter power density alone, it is useful to use in conjunction with other process variables when fine-tuning is necessary. When the zero-point of the film stress cannot be dialed in using fixed target sputter power density and sputter signal frequency and variable sputter signal duty cycle, re-adjustment of the target sputter power density and sputter signal frequency becomes necessary. An accompanying re-adjustment of the sputter signal duty cycle may be needed to fine-tune the stress. Several iterations of this process may be required. If successful the target sputter power density (2-10 W/cm$^2$), sputter signal frequency (0-13.65 MHz), and sputter signal duty cycle (5-100%) will be fixed and thin films of any thickness may be deposited at the zero-stress level. If unsuccessful, a re-adjustment of the process pressure and/or substrate temperature may be necessary since altering either of these process variables will shift the process window obtainable with the sputter process parameters. The adjustment process for the sputter process parameters will begin anew at this point.

In the case where no set of sputter process variables can be found that results in a zero-stress level, other PVD techniques must be explored.

The method of obtaining stress controlled sputtered PVD deposition of thin films is shown in the flow chart 180 of FIG. 14. The first decision point 181 is whether varying the substrate temperature and process pressure have been explored to obtain the desired stress state of the thin film. If the answer is no, then varying the process pressure over the range from $10^{-3}$ to $10^{-9}$ torr and the substrate temperature over the range from −100 C to 800 C, can be attempted at the decision point 182. If this allows the desired stress level to be obtained, then the process pressure and substrate temperature can be adjusted accordingly over the range from $10^{-3}$ to $10^{-9}$ torr and from −100 C to 800 C, respectively, to develop a PVD deposition process for a thin film having a desired stress state at step 183. If adjustment of process pressure and substrate temperature do not allow the desired stress state to be obtained during deposition, then the next decision point 184 is whether the sputtering power density can be used within the process window to obtain the desired stress state in the thin film. It the answer at decision point 184 is yes, then all other parameters are fixed and the sputtering power density is adjusted accordingly over the range from 2 to 10 W/cm$^2$ 185 to obtain the desired stress state.

If the answer at decision point 184 is no, then the sputtering power density is fixed at a value and the sputter signal frequency is adjusted over the allowable range from 0 to 13.56 MHz. At decision point 186, it is determined whether the range of sputter signal frequency is within the desired process window. If adjustment of the signal frequency over this range allows the desired stress state to be obtained, then a recipe for the desired process is obtained at step 187. If not, then the sputter power density and the sputtering signal frequency are fixed and the duty cycle is adjusted and it will be determined whether they can be adjusted over the process window at decision point 188. If fixing all other process parameters and adjusting the duty cycle over the range from 5 to 100% allows the desired stress state to be obtained, a process recipe is obtained at step 191. If at decision point 188, that adjusting the duty cycle does not allow the desired process to be obtained, then the process development cycles back to decision point 184 wherein the sputtering power density is attempted to be adjusted again to obtain the desired stress state in the thin film.

If the process development cycle has been repeated some reasonable number of times (e.g., 10 or more times) and at decision point 188 that adjustment of the duty cycle, after the power density and signal frequency have been tuned, and the desired stress state has not been obtained, then the development proceeds to decision point 190 wherein it is asked whether the process pressure and substrate temperature can be further adjusted. If they cannot, it can be determined that no solution for obtaining the desired process recipe using ion bombardment and sputter PVD deposition can be obtained 192. If on the other hand it is determined at decision point 190 that the process pressure and substrate temperature can be further adjusted, then these process parameters are suitably adjusted at step 189 and the process development then cycles back to decision point 184, as shown in the development flow chart 180 of FIG. 14.

A specific example of the method to obtain a desired stress state in a Nickel thin film is now described. It should be noted that Nickel thin films are notoriously difficult to deposit using PVD of any thickness over a few hundred nanometers due to the excessive stresses that these thin films exhibit. Referring to the flow chart 160, of FIG. 13, determination of a process recipe, that is, the exact process settings or parameters, to result in a zero-stress state of the deposited Nickel thin film begins with fixing the process pressure and substrate temperature. The process pressure is a predetermined parameter based upon the specific evaporation system configuration and is set to 1.5E-6 Torr. The substrate temperature is fixed to room temperature (20° C.). With these process parameters fixed, the ion gun current of a gridless, end-Hall type ion source is adjusted. Adjusting the ion gun current to 2A resulted in a Ni film stress of −135 MPa from an initial tensile stress of +1354 MPa. To reduce the Ni film stress further, adjustment of the ion gun voltage to 162 V resulted in a Ni film stress of +27 MPa at a film thickness of 1000 Angstroms. Since 27 MPa considered a very low value, that is, a zero-near value of stress, the process is now considered to be developed so as to allow a zero state of stress in Nickel PVD deposition.

The method for obtaining the desired state of stress in thin films of the present invention can be used for any metal, semiconductor, dielectric, or ceramic material type that can be deposited using means of PVD. Importantly, the example provided for a Nickel thin films had a specific goal of a near-zero state of stress, however it should be understood that the method described in the present invention can be used to obtain a thin films having a compressive stress state or a tensile stress state, as well as a zero stress state. That is, the stress state desired, depending on the device design and application, can be obtained using the present invention. However, for most micro- and nano-fabrication process sequences, it is most often desired that the thin films have either a zero stress state or a mildly tensile (e.g., less than 100 MPa) state of stress.

It is important to note that the present invention allows the temperature of the deposition to be constrained to some pre-determined level and the other process parameters adjusted accordingly to obtain a pre-determined and desired stress state in the deposited thin film. For example, many micro- and nano-fabrication process sequences require that the substrate undergo all processing below some threshold temperature so as to prevent damage or degradation of the material and/or devices already on the substrate sample.

The method for obtaining the desired state of stress in thin films of the present invention can be followed as described herein as a step-by-step process method that is portrayed in the flow charts of 140, 160 and 180 to obtain the desired result. However, the present invention also encompasses a software algorithm, in which the method described and portrayed in the flow charts is incorporated into a coded set of instructions and decision points. The algorithm would have certain inputs that are based on desired material properties and a set of PVD deposition tool settings that can be varied. With these inputs, the algorithm would provide the user with directions on which process parameters to adjust in a specific hierarchy, with the most important parameter adjusted first, the second most important parameter adjusted next, and so on, until the desired process setting for the desired stress state in the thin film material is obtained. As the user adjusts the process parameters in the hierarchy dictated by the algorithm, the user would input new results of the process results into the algorithm, and the process settings of the parameters would converge onto a set of process parameters providing the desired state of stress for the thin film.

The method for obtaining the desired state of stress in thin films of the present invention as described above as a step-by-step proceed method and which are portrayed in the flow charts of 140, 160 and 180 to obtain the desired result, are essentially an open-loop system. The present invention also includes a method for process parameter monitoring through in situ, closed-loop deposition parameter control for the control of the state of stress in deposited thin films.

Closed-loop deposition parameter control enables predetermined, as designed, stress-states in deposited thin films, and eliminates the current and unprofitable current method of multiple iterations of process development, adjustment, and characterization that are necessary in open-loop deposition systems because of process drift and as a result uncontrolled film stress states. While the method of open loop thin film deposition is effective, it can be costly and time consuming and also consumes an inordinate amount of resources. In contrast, the ability to obtain thin film depositions with pre-determined stress states using closed-loop control of the deposition process as described in the present invention, is a further enormous improvement over the current methods.

The present invention also includes a system by which the stress state in the thin film can be closed-loop controlled using in situ thin film residual stress monitoring for determining bombardment specie and energy, which will reduce significantly the number and length of depositions and post-deposition stress measurements that are needed to develop a set of process parameters for the PVD deposition process wherein a desired and pre-determined state of stress of thin film can be obtained.

FIG. 1 shows an evaporation PVD system 81 wherein a ion beam source 194 is included in the chamber 82 that has the ion beam 193 directed from the ion beam source 194 onto the substrate 84. Included in the evaporation system 81 is a closed-loop control system to automatically adjust the process parameters so as to obtain the desired stress state of the deposited thin film. The closed-loop control system includes a stress monitoring system 196 that provide real-time in situ measurement of the film stress on a sensor 195 that experiences the same process conditions as the substrate 84. The data from the stress monitoring system 196 is fed back through a communication line 198 into the closed-loop controller 197 which takes the measurement data and based on the algorithm provides electrical signals through a communication line 199 to the ion beam source 194 so as to adjust the ion beam current and voltage to values that more properly met the stress state values that are desired. The closed-loop controller also is connected to sensors for both the process chamber pressure and the substrate temperature as well as the deposition rate and all of these measurements are taken collectively together and used in the algorithm to automatically adjust in real time the process parameters so as to obtain a pre-determined state of stress in thin films deposited using PVD.

It should be noted that while FIG. 1 illustrates a closed-loop PVD deposition system based on evaporative deposition, that the same invention of closed-loop control can be implemented for sputter PVD deposition.

In lieu of bombardment with an inert gas, a reactive gas such as oxygen or nitrogen may be used to not only supply energy to the growing thin film by transfer of kinetic energy to adatoms, but also tailor the composition of the thin film material in the present invention. This is particularly useful when depositing oxides and nitrides, since the bombardment with oxygen and nitrogen will result in incorporation of these atoms through chemical reaction and implantation in the film and provide stoichiometric modification, where otherwise the deposited oxide or nitride would be sub-stoichiometric. Regarding deposited nitrides, nitrogen is notoriously hard to disassociate from its diatomic form and react to form a nitride in the absence of a plasma. The ion-assisted deposition (IAD) of the present invention using oxygen or nitrogen can supply the growing film with the specie necessary to correct for standard evaporation PVD compositional shortcomings as well as provide stress control.

Using the thin film stress-control strategies of the present invention allows the design window for micro- and nano-fabricated devices and structures to be increased thereby increasing dramatically the number and diversity of materials that are able to be consistently deposited in a pre-determined, that is, "as designed" stress-state. In turn, this enables an increase in the overall design window, removes current device design restrictions, improves production yields, decreases development costs and times, increases the performance of devices, and increases the number of device types that can be produced due to removal of current design limitations. The impact is to lower costs to designers and developers of micro- and nano-devices and structures due to enabling higher fabrication yields.

The present invention allows designers and developers of micro- and nano-devices and structures to design the stress-state of thin films which also allows the prediction of the performance of the fabricated devices with a high level of certainty, thereby lowering costs, development time, and risks.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A closed-loop feedback control physical vapor deposition ("PVD") system comprising:
   a chamber configured to control pressure and substrate temperature of a PVD process and to hold a substrate on which a thin film is to be deposited by a physical vapor deposition ("PVD") process to fabricate micro-electro-mechanical systems ("MEMS"), nano-electro-mechanical systems ("NEMS"), a microelectronics circuit or device, a photonic device, micro-device or nano-device designed to meet a performance requirement that depends on stress in the thin film being deposited and a performance requirement that depends on morphology and conformality of the thin film being deposited;
   a stress monitoring system configured to measure the stress in the thin film as it is being deposited;
   a first sensor configured to measure chamber pressure;
   a second sensor configured to measure substrate temperature;
   a gridless ion gun configured to generate ions with an accelerating potential difference produced by electrons from cathode-neutralizing entering a magnetic field setup by permanent magnets in a source, and wherein acceleration of the ions takes place in a quasi-neutral plasma formed by gas ionized by the generated ions and having an approximately equal densities of electrons and ions; and
   a controller coupled to the stress monitoring system, the first sensor, and the second sensor, the controller configured to control the PVD system to at least:
      set a pressure of the chamber and a substrate temperature for the PVD process;
      after setting the pressure of the chamber and the substrate temperature for the PVD process, and during the deposition of the thin film on the substrate at the set pressure and the set substrate temperature of the PVD process, determine, based on information received from the stress monitoring system, whether the stress in the thin film being deposited will cause the performance requirement which depends on the stress in the thin film to be not satisfied;
      when a determination is made that the stress in the thin film being deposited at the set pressure and the set substrate temperature will not cause the performance requirement which depends on the stress in the thin film to be not satisfied, control the deposition of the thin film on the substrate at the set pressure and the set substrate temperature of the PVD process without adjusting current and voltage for an ion bombardment of the thin film by the ion gun;
      when a determination is made that the stress in the thin film being deposited at the set pressure and the set substrate temperature will cause the performance requirement which depends on the stress in the thin film to be not satisfied, determining whether adjusting the set pressure within a predetermined pressure process window between $10^{-3}$ to $10^{-9}$ Torr will change the stress of the thin film towards a level of zero stress;
      when a determination is made that adjusting the set pressure within the predetermined pressure process window will change the stress of the thin film towards a level of zero stress, adjusting the set pressure within the predetermined pressure process window and determine whether adjusting the set pressure within the predetermined pressure process window will change the morphology of the thin film being deposited and conformality of the thin film being deposited such that the performance requirement which depends on the morphology of the thin film being deposited and the conformality of the thin film is not satisfied;
      when a determination is made that adjusting the set pressure within the predetermined pressure process window will not change the morphology of the thin film being deposited and the conformality of the thin film being deposited such that the performance requirement which depends on the morphology of the thin film being deposited and the conformality of the thin film is not satisfied, adjust the set pressure within the predetermined pressure process window to change the stress of the thin film towards a level of zero stress and control the deposition of the thin film on the substrate at the adjusted pressure and the set substrate temperature of the PVD process;
      when a determination is made that adjusting the set pressure within the predetermined pressure process window will change the morphology of the thin film being deposited and the conformality of the thin film being deposited such that the performance requirement which depends on the morphology of the thin film being deposited and the conformality of the thin film is not satisfied, determine whether adjusting the set substrate temperature within a predetermined temperature process window between $-100°$ to $+800°$ C. will change the stress of the thin film towards a level of zero stress;
      when a determination is made that adjusting the set substrate temperature within the predetermined temperature process window will change the stress of the thin film towards a level of zero stress, determine whether adjusting the substrate temperature within the predetermined temperature process window will change the morphology of the thin film being deposited and the conformality of the thin film being deposited such that the performance requirement which depends on the morphology of the thin film being deposited and the conformality of the thin film is not satisfied;
      when a determination is made that adjusting the substrate temperature within the predetermined temperature process window will not change the morphology of the thin film being deposited and the conformality of the thin film being deposited such that the performance requirement which depends on the morphology of the thin film being deposited and the conformality of the thin film is not satisfied, adjust the substrate temperature within the predetermined temperature process window to change the stress of the thin film towards a level of zero stress and control the deposition of the thin film on the substrate at the adjusted pressure and the adjusted substrate temperature of the PVD process; and
      when a determination is made that adjusting the substrate temperature within the predetermined temperature process window will change the morphology of the thin film being deposited and the conformality of the thin film being deposited such that the performance requirement which depends on the morphology of the thin film being deposited and the conformality of the thin film is not satisfied, control current and voltage for an ion bombardment by the ion gun of the thin film to reduce energy in the thin film and thereby the stress in the thin film while making no further changes in the set pressure and in the substrate temperature during the deposition of the thin film, wherein the thin film being deposited on the substrate is a layer of a multilayer thin film structure including at least one sacrificial thin film layer onto which the thin film layer is deposited, and at least a portion of the thin film layer is attached to the substrate, and wherein the substrate temperature is lowered through cooling of the substrate using liquid nitrogen or chilled water and the substrate temperature is increased through heating the substrate with a resistive heater in contact with the substrate or by irradiation of the substrate from a source of infrared or visible wavelengths.

2. The PVD system of claim 1, wherein the thin film being deposited on the substrate is a layer of a multilayer thin film structure.

3. The PVD system of claim 1, wherein the thin film being deposited on the substrate is an amorphous thin film.

4. The PVD system of claim 1, wherein the stress in the thin film being deposited exceeds ±200 megapascals (MPa).

5. The PVD system of claim 1, wherein adjusting the set pressure within the predetermined pressure process window to change the stress of the stress of the thin film towards a level of zero stress, comprises:

when tensile stress in the thin film needs to be increased to change stress in the thin film to below +200 MPa and towards zero stress, increasing the process pressure to change the stress in the thin film to below +200 MPa and towards zero stress; and when compressive stress in the thin film needs to be increased to change the stress in the thin film to above −200 MPa and towards zero stress, decreasing the pressure to change the stress in the thin film to above −200 MPa and towards zero stress.

6. The PVD system of claim 1, wherein the predetermined temperature process window includes a lower temperature that is below 0 degrees C. and a higher temperature that is greater than 250 degrees C.

7. The PVD system of claim 1, wherein upon determining that adjusting the set substrate temperature within the predetermined temperature process window will change the stress of the thin film towards a level of zero stress, adjusting the substrate temperature within the predetermined temperature process window to change the thin film stress level towards zero stress, wherein adjusting the substrate temperature within the predetermined temperature process window comprises:

when tensile stress in the thin film needs to be increased to change the thin film stress level to below +200 MPa and towards zero stress, decreasing the substrate temperature to at least below 200 C to change the thin film stress level to below +200 MPa and towards zero stress, and when compressive stress in the thin film needs to be increased to change the stress in the thin film to above −200 MPa and towards zero stress, increasing the substrate temperature to at least above 20° C. to change the stress in the thin film to above −200 MPa and towards zero stress.

8. The PVD system of claim 1, the controller is further configured to:

(a) when either (1) the ion gun is already being used to bombard the thin film with ions, increase tensile stress in the thin film being deposited by decreasing ion gun current below a predetermined first current level, or increase compressive stress in the thin film being deposited by increasing the ion gun current above a predetermined first current range, or (2) the ion gun is not already being used, increase tensile stress in the thin film being deposited by not using the ion gun, and then (3) determine if the stress in the thin film being deposited can be moved towards a level of zero stress as the ion gun current is varied within a predetermined ion gun current process window for varying the ion gun current, (b) when a determination has been made that the stress in the thin film being deposited can be moved towards a level of zero stress as the ion gun current is varied within the predetermined ion gun current process window, adjust, while not changing ion gun acceleration voltage, the ion gun current accordingly so that the thin film stress is changed towards a level of zero stress, (c) when a determination has been made that the stress in the thin film being deposited cannot be moved towards a level of zero stress as the ion gun current is varied within the ion gun current process window, and if either (1) the ion gun is already being used, increase tensile stress in the thin film being deposited by decreasing ion gun acceleration voltage below a first voltage level or increasing compressive stress by increasing ion gun acceleration voltage above a second voltage level, or (2) the ion gun is not already being used, increase tensile stress by not using the ion gun, and then (3) determine if the stress in the thin film being deposited can be moved towards a level of zero stress as the ion gun acceleration voltage is varied within a predetermined ion gun voltage process window for varying the ion gun acceleration voltage, (d) when a determination has been made that the thin film stress can be moved towards a level of zero stress as the ion gun acceleration voltage is varied within the predetermined ion gun voltage process window, while not changing the ion gun's current, then adjust the ion gun acceleration voltage accordingly within the predetermined ion gun voltage process window so that the thin film stress is moved towards a level of zero stress, (e) when a determination has been made that the thin film stress cannot be moved towards a level of zero stress as the ion gun acceleration voltage is varied within the ion gun voltage process window, adjust and fix the ion gun acceleration voltage to be within the predetermined ion gun voltage process window, and then repeat steps (a) to (f) until a determination has been made that the thin film stress is either moved towards a level of zero stress or not moved away from the level of zero stress a plurality of times, (f) when a determination has been made a plurality of times that the thin film stress cannot be moved towards a level of zero stress as the ion gun current and/or voltage is/are varied within the predetermined ion gun current process window and within the predetermined ion gun voltage process window, respectively, determine if the ion gun's current and/or voltage limits have been reached, and (g) when a determination has been made that the ion gun's current and/or voltage limits have been reached, determine if the process pressure and/or substrate temperature can be further adjusted to change the thin film stress level towards a level of zero stress, (g) when a determination has been made that the process pressure or substrate temperature or process pressure and substrate temperature can be further adjusted, adjust the process pressure to be within the predetermined pressure process window, and/or the substrate temperature to be within the predetermined temperature process window, and then repeat steps (c) to (f) until either a determination has been made that the thin film stress level is changed towards a level of zero stress or not, (h) when a determination has been made that the process pressure, substrate temperature or process pressure and substrate temperature cannot be further adjusted, control another physical vapor deposition technique to control the thin film stress.

9. The PVD system of claim 8, wherein the predetermined first current level is below 2 amps, the predetermined first current range is above 2-12 amps and the predetermined ion gun current process window is within a range of 2-12 amps.

10. The PVD system of claim 8, wherein adjusting ion source current to change the thin film stress level towards zero stress comprises:
when the tensile stress in the thin film needs to be increased to change the thin film stress level to below +200 MPa and towards zero stress, decreasing the ion source current to at least below 2 amps to change the thin film stress level to below +200 MPa and towards zero stress, and
when the compressive stress in the thin film needs to be increased to change the stress in the thin film to above −200 MPa and towards zero stress, increasing the ion source current to at least above 2 amps to change the stress in the thin film to above −200 MPa and towards zero stress.

11. The PVD system of claim 8, wherein the first voltage level is below 200 volts, the second voltage level is above 200 volts and the predetermined ion gun voltage process window is within a range of 100-300 volts.

12. The PVD system of claim 1, wherein ion source voltage is adjusted to change the thin film stress level towards zero stress and comprises, when tensile stress in the thin film needs to be increased to change the thin film stress level to below +200 MPa and towards zero stress, decreasing the ion source voltage to at least below 200 volts to change the thin film stress level to below +200 MPa and towards zero stress, and when compressive stress in the thin film needs to be increased to change the stress in the thin film to above −200 MPa and towards zero stress, increasing the ion source voltage to at least above 200 volts to change the stress in the thin film to above −200 MPa and towards zero stress.

13. The PVD system of claim 1, wherein the thin film is deposited on the substrate by sputtering physical vapor deposition and the controller is further configured to:
(a) adjust target sputter power density for the target sputter power density to be within a predetermined target power density process window for varying the target power density to thereby adjust thin film stress to move towards a level of zero stress and thin film conformality to not be in one or more of undesired states, and then determine if the target sputter power density is or is not within the predetermined target power density process window,
(b) when a determination has been made that the target sputter power density is within the target power density process window, then while not changing all other process parameters, adjust sputter power density accordingly within the predetermined target power density process window so that the thin film stress is changed towards a level of zero stress,
(c) when a determination has been made that the adjusted target sputter power density is not within the predetermined target power density process window, then while not changing the target sputter power density, adjust sputter signal frequency in an attempt for the sputter signal frequency to be within a predetermined sputter signal frequency process window for varying the sputter signal frequency to thereby adjust thin film stress towards a level of zero stress and conformality to not be in one or more of the undesired states, and then determine if the sputter signal frequency is or is not within the predetermined sputter signal frequency process window,
(d) when a determination has been made that the sputter signal frequency is within the predetermined sputter signal frequency process window, while not changing all other process parameters, adjust sputter signal frequency accordingly for the sputter signal frequency to be within the predetermined sputter signal frequency process window so that the thin film stress is moved towards a level of zero stress,
(e) when a determination has been made that the sputter signal frequency is not within the predetermined sputter signal frequency process window, then while not changing the target sputter power density and the sputter signal frequency, adjust sputter signal duty cycle for the sputter signal duty cycle to be within a predetermined sputter signal duty cycle process window to thereby adjust film stress or conformality or film stress and conformality, and then determine if the sputter signal duty cycle is within a predetermined sputter signal duty cycle process window for varying the sputter signal duty cycle,
(f) when a determination has been made that the sputter signal duty cycle is within the predetermined sputter signal duty cycle process window, then while not changing all other parameters, adjust sputter signal duty cycle accordingly within the predetermined sputter signal duty cycle process window so that the thin film stress is moved towards a level of zero stress,
(g) when a determination has been made that the sputter signal duty cycle is not within the predetermined sputter signal duty cycle process window, then repeat steps (c) to (h) until a determination is made that the sputter signal duty cycle is within the predetermined sputter signal duty cycle process window so that the thin film stress is moved towards a level of zero stress or not within the predetermined sputter signal duty cycle process window a plurality of times, and
(h) when a determination has been made a plurality of times that the sputter signal duty cycle is not within the predetermined sputter signal duty cycle process window, then determine whether or not the target sputter power density, sputter signal frequency, and sputter signal duty cycle limits have been reached on sputter power supply, and
(i) when a determination is made that the target sputter power density, sputter signal frequency, and sputter signal duty cycle limits have been reached on the sputter power supply, then determine if the process pressure or substrate temperature or process pressure and substrate temperature can be further adjusted to change the thin film stress level towards a level of zero stress,
(j) when a determination has been made that the process pressure and/or substrate temperature can be further adjusted, then adjust the process pressure to be within the predetermined pressure process window and/or the substrate temperature to be within the predetermined temperature process window, and then repeating steps (a) to (j) until a determination has been made that either the thin film stress level is changed towards a level of zero stress, or not, and then a determination has been made that the process pressure and/or the substrate temperature cannot be further adjusted, such that other physical vapor deposition techniques to control the thin film stress should be explored, (k) when a determination has been made that the process pressure, substrate temperature or process pressure and substrate temperature cannot be further adjusted, control operation of another physical vapor deposition technique to control the thin film stress.

14. The PVD system of claim 13, wherein the predetermined target power density process window is from 2 to 10 W/cm$^2$.

15. The PVD system of claim 13, wherein the predetermined sputter signal frequency process window is from 0 to 13.56 MHz.

16. The PVD system of claim 13, wherein the predetermined sputter signal duty cycle process window is from 5 to 100%.

17. The PVD system of claim 13, wherein the target sputter power density being adjusted to change the thin film stress level towards zero stress comprises:
when tensile stress in the thin film needs to be increased to change the thin film stress level to below +200 MPa and towards zero stress, decreasing the target sputter power density to change the thin film stress level to below +200 MPa and towards zero stress, and
when compressive stress in the thin film needs to be increased to change the stress in the thin film to above −200 MPa and towards zero stress, increasing the target sputter power density to change the stress in the thin film to above −200 MPa and towards zero stress.

18. A closed-loop feedback control physical vapor deposition ("PVD") system comprising:
a chamber configured to control pressure and substrate temperature of a PVD process and to hold a substrate on which a thin film is to be deposited by a physical vapor deposition ("PVD") process to fabricate micro-electro-mechanical systems ("MEMS"), nano-electro-mechanical systems ("NEMS"), a microelectronic device or circuit, a photonic device, micro-device or nano-device designed to meet a performance requirement that depends on stress in the thin film being deposited and a performance requirement that depends on morphology and conformality of the thin film being deposited;
a stress monitoring system configured to measure the stress in the thin film as it is being deposited;
a first sensor configured to measure chamber pressure;
a second sensor configured to measure substrate temperature;
a gridless ion gun configured to generate ions with an accelerating potential difference produced by electrons from cathode-neutralizing entering a magnetic field setup by permanent magnets in a source, and wherein acceleration of the ions takes place in a quasi-neutral plasma formed by gas ionized by the generated ions and having an approximately equal densities of electrons and ions; and
a controller coupled to the stress monitoring system, the first sensor, and the second sensor, the controller configured to control the PVD system to at least:

set a process pressure of the chamber, a substrate temperature, a target sputter power density, sputter signal frequency, and sputter signal duty cycle for the PVD process;

(a) during the deposition of the thin film on the substrate at the set pressure and the set substrate temperature of the PVD process, determine, based on information received from the stress monitoring system, whether excessive stress level in the thin film can be changed towards a level of zero stress by (i) adjusting the set process pressure at which the thin film is deposited on the substrate so as to be within a predetermined pressure process window between $10^{-3}$ to $10^{-9}$ Torr, or (ii) adjusting the set temperature of the substrate on which the thin film is deposited to be within a predetermined temperature process window that is below 0 degrees C. or greater than 250 degrees C.;

(b) upon determining in step (a) that the excessive stress level in the thin film cannot be changed from being excessive and towards a level of zero stress by adjusting the set process pressure and that the excessive stress level in the thin film cannot be changed towards a level of zero stress by adjusting the temperature of the substrate, while maintaining the set process pressure and the set temperature of the substrate, adjust the set target sputter power density within a predetermined target power density process window between 2 and 10 W/cm$^2$ for varying the target power density to thereby adjust the thin film stress to not be excessive and moved towards a level of zero stress and thin film conformality to not be in one or more of undesired states, and then determine whether adjusting the set target sputter power density within the predetermined target power density process window will keep the stress in the thin film to be excessive and make the thin film conformality to be in one or more of the undesired states;

c) upon determining in step (b) that adjusting the target sputter power density within the predetermined target power density process window will keep the stress in the thin film to be excessive and will make the thin film conformality to be in one or more of the undesired states, while maintaining the set target sputter power density adjusted in step (b), adjusting the set sputter signal frequency within a predetermined sputter signal frequency process window between 0 to 13.56 MHz for varying the sputter signal frequency to thereby adjust thin film stress to not be excessive and moved towards a level of zero stress and thin film conformality to not be in one or more of the undesired states, and then determining whether adjusting the sputter signal frequency within the predetermined sputter signal frequency process window will keep the stress in the thin film to be excessive and make the thin film conformality to be in one or more of the undesired states;

(d) upon determining in step (c) that adjusting the sputter signal frequency within the predetermined sputter signal frequency process window will keep the stress in the thin film to be excessive and will make the thin film conformality to be in one or more of the undesired states, then while maintaining the set target sputter power density adjusted in step (b) and set sputter signal frequency adjusted in step (c), adjust sputter signal duty cycle within a predetermined sputter signal duty cycle process window between 5 and 100% for varying the sputter signal duty cycle to thereby adjust film stress to not be excessive and moved towards a level of zero stress and thin film conformality to not be in one or more of the undesired states, and then determining whether adjusting the sputter signal duty cycle within the predetermined sputter signal duty cycle process window for varying the sputter signal duty cycle will keep the stress in the thin film to be excessive and/or make the thin film conformality to be in one or more of the undesired states, (e) upon determining that adjusting the sputter signal duty cycle within the predetermined sputter signal duty cycle process window will keep the stress in the thin film to be excessive and/or make the thin film conformality to be in one or more of the undesired states, then repeat steps (b) to (d) so that the thin film stress is changed to not be excessive and moved towards a level of zero stress;

(f) determine whether limits for adjusting the set target sputter power density, the set sputter signal frequency, and the set sputter signal duty cycle have been reached on sputter power supply;

(g) upon determining that the limits for adjusting the set target sputter power density, the set sputter signal frequency, and the set sputter signal duty cycle limits have been reached on the sputter power supply, determine if the set process pressure and the set substrate temperature can be further adjusted to change the thin film stress level from being excessive and towards a level of zero stress; and (h) upon determining that the set process pressure and the set substrate temperature can be further adjusted to reduce the stress of the thin film towards a level of zero stress, adjust the set process pressure at which the thin film is deposited to be within the predetermined pressure process window and the set temperature of the substrate on which the thin film is deposited to be within the predetermined temperature process window, and then repeat steps (b) to (d) to change the stress in the thin film from being excessive and towards a level of zero stress, wherein the thin film being deposited on the substrate is a layer of a multilayer thin film structure including at least one sacrificial thin film layer onto which the thin film layer is deposited, and at least a portion of the thin film layer is attached to the substrate, and wherein the substrate temperature is lowered through cooling of the substrate using liquid nitrogen or chilled water and the substrate temperature is increased through heating the substrate with a resistive heater in contact with the substrate or by irradiation of the substrate from a source of infrared radiation or visible wavelengths.

19. A method of controlling stress in a thin film while the thin film is being deposited over pre-existing topography of a substrate by a physical vapor deposition ("PVD") process on a substrate to fabricate a micro-electro-mechanical system ("MEMS"), a nano-electro-mechanical system ("NEMS"), a photonic device, a micro-device or a nano-device designed to meet a performance requirement that depends on the stress in the thin film being deposited and a performance requirement that depends on morphology of the thin film being deposited and conformality of the thin film being deposited over the pre-existing topography of the substrate, the method comprising:

set a pressure of a chamber configured to control the PVD process and a substrate temperature for the PVD process;

during the deposition of the thin film on the substrate at the set pressure and the set substrate temperature of the PVD process, determining, based on measurements received from a stress monitoring system during the deposition of the thin film, whether the stress in the thin film being deposited causes the performance requirement which depends on the stress in the thin film to be not satisfied;

upon determining that the stress in the thin film being deposited at the set pressure and the set substrate temperature will not cause the performance requirement which depends on the stress in the thin film to be not satisfied, control the deposition of the thin film on the substrate at the set pressure and the set substrate temperature of the PVD process without adjusting current and voltage for an ion bombardment of the thin film;

upon determining that the stress in the thin film being deposited at the set pressure and the set substrate temperature causes the performance requirement which depends on the stress in the thin film to be not satisfied, determining whether adjusting the set pressure within a predetermined pressure process window between $10^{-3}$ to $10^{-9}$ Torr will change the stress of the thin film towards zero stress;

upon determining that adjusting the set pressure within the predetermined pressure process window will change the stress of the thin film towards zero stress, adjusting the set pressure within the predetermined pressure process window and determining whether adjusting the set pressure within the predetermined pressure process window will change the morphology of the thin film being deposited and the conformality of the thin film being deposited over the pre-existing topography of the substrate such that the performance requirement which depends on the morphology of the thin film being deposited and the conformality of the thin film over the pre-existing topography of the substrate is not satisfied;

upon determining that adjusting the set pressure within the predetermined pressure process window will not change the morphology of the thin film being deposited and the conformality of the thin film being deposited such that the performance requirement which depends on the morphology of the thin film being deposited and the conformality of the thin film is not satisfied, adjusting the set pressure within the predetermined pressure process window to change the stress of the thin film towards zero stress and control the deposition of the thin film on the substrate at the adjusted pressure and the set substrate temperature of the PVD process;

upon determining that adjusting the set pressure within the predetermined pressure process window will change the morphology of the thin film being deposited and the conformality of the thin film being deposited over the pre-existing topography of the substrate such that the performance requirement which depend on the morphology of the thin film being deposited and the conformality of the thin film is not satisfied, determining whether adjusting the set substrate temperature within a predetermined temperature process window between −100° to +800° C. will change the stress of the thin film towards zero stress;

upon determining that adjusting the set substrate temperature within the predetermined temperature process window will change the stress of the thin film towards zero stress, determining whether adjusting the substrate temperature within the predetermined temperature process window will change the morphology of the thin film being deposited and the conformality of the thin film being deposited such that the performance requirement which depends on the morphology of the thin film being deposited and the conformality of the thin film is not satisfied; and upon determining that adjusting the substrate temperature within the predetermined temperature process window will change the morphology of the thin film being deposited and the conformality of the thin film being deposited such that the performance requirement which depends on the morphology of the thin film being deposited and the conformality of the thin film is not satisfied, separately control current and voltage of a gridless ion gun configured to bombard the thin film with ions during the deposition of the thin film on the substrate to reduce the energy in the thin film and thereby the stress in the thin film while making no further changes in the process pressure or in the substrate temperature, wherein the gridless ion gun configured to generate ions with an accelerating potential difference produced by electrons from cathode-neutralizer entering a magnetic field setup by permanent magnets in a source, and wherein acceleration of the ions takes place in a quasi-neutral plasma formed by gas ionized by the generated ions and having an approximately equal densities of electrons and ions, wherein the substrate temperature is lowered through cooling of the substrate using liquid nitrogen or chilled water and the substrate temperature is increased through heating the substrate with a resistive heater in contact with the substrate or by irradiation of the substrate from a source of infrared radiation or visible wavelengths.

20. The method of claim 19 wherein the thin film is being deposited on the substrate by evaporated physical vapor deposition and the method further comprises:

(a) when either (1) the ion gun is already being used to bombard the thin film with ions, increasing tensile stress in the thin film being deposited by decreasing the ion gun current below a predetermined first current level, or increasing compressive stress in the thin film being deposited by increasing the ion gun current above a predetermined first current range above 2 amps, or (2) the ion gun is not already being used, increasing tensile stress in the thin film being deposited by not using the ion gun, and then (3) determining if the stress in the thin film being deposited can be moved towards zero stress as the ion gun current is varied within a predetermined ion gun current process window above 2 amps for varying the ion gun current, (b) when a determination has been made that the stress in the thin film being deposited can be moved towards the zero stress as the ion gun current is varied within the predetermined ion gun current process window, adjusting, while not changing the ion gun's acceleration voltage, the ion gun current accordingly so that the thin film stress is changed to not be excessive and moved towards zero stress, (c) when a determination has been made that the stress in the thin film being deposited cannot be moved towards zero stress as the ion gun current is varied within the ion gun current process window, and if either (1) the ion gun is already being used, increasing tensile stress in the thin film being deposited by decreasing ion gun voltage below a first voltage level or increasing compressive stress by increasing ion gun voltage above a second voltage level, or (2) the ion gun is not already being used, increasing tensile stress by not using the ion gun, and then (3) determining if the stress in the thin film being deposited can be moved towards zero stress as the ion gun voltage is varied within a predetermined ion gun voltage process window between 100 and 300 volts for varying the ion gun voltage, (d) when a determination has been made that the thin film stress can be moved towards zero stress as the ion gun voltage is varied within the predetermined ion gun voltage process window, while not changing the ion gun's current, then adjusting the ion gun's acceleration voltage accordingly within the predetermined ion gun voltage process window so that the thin film stress is moved towards zero stress, (e) when a determination has been made that the thin film stress cannot be moved towards zero stress as the ion gun voltage is varied within the ion gun voltage process window, adjusting and fixing the ion gun's acceleration voltage to be within the predetermined ion gun voltage process window, and then repeating steps (a) to (f) until a determination has been made that the thin film stress is either moved away from being excessive and towards zero stress or not moved away from being excessive and towards zero stress a plurality of times, (f) when a determination has been made a plurality of times that the thin film stress cannot be moved away from being excessive and towards zero stress as the ion gun current and/or voltage is/are varied within the predetermined ion gun current process window and within the predetermined ion gun voltage process window, respectively, determining if the ion gun's current and/or voltage limits have been reached, and (g) when a determination has been made that the ion gun's current and/or voltage limits have been reached, determining if the process pressure and/or substrate temperature can be further adjusted to change the thin film stress level from being excessive and towards zero stress, (h) when a determination has been made that the process pressure or substrate temperature or process pressure and substrate temperature can be further adjusted, adjusting the process pressure to be within the predetermined pressure process window, and/or the substrate temperature to be within the predetermined temperature process window, and then repeating steps (c) to (f) until either a determination has been made that the thin film stress level is changed from being excessive and towards zero stress, or not, and then a determination has been made that the process pressure and/or the substrate temperature cannot be further adjusted, such that other physical vapor deposition techniques to control the thin film stress should be explored, and (i) when a determination has been made that the process pressure, substrate temperature or process pressure and substrate temperature cannot be further adjusted, using another physical vapor deposition technique to control the thin film stress.

21. A closed-loop feedback control method of controlling stress in a thin film with an excessive stress level while the thin film is being deposited over pre-existing topography of a substrate by an evaporated physical vapor deposition ("PVD") process on a substrate to fabricate a micro-electromechanical system ("MEMS"), a nano-electro-mechanical system ("NEMS"), a photonic device, a micro-device or a nano-device on the substrate, the evaporated PVD process includes depositing the thin film on the substrate at a set process pressure and a set temperature of the substrate, and using t a gridless ion gun to bombard the thin film with ions at a set ion gun current and a set ion gun voltage, the stress in the thin film being deposited being determined during the deposition of the thin film based on measurements received from a stress monitoring system during the deposition of the thin film over the pre-existing topography of the substrate, wherein the gridless ion gun configured to generate ions with an accelerating potential difference produced by electrons from cathode-neutralizer entering a magnetic field setup by permanent magnets in a source, and wherein acceleration of the ions takes place in a quasi-neutral plasma formed by gas ionized by the generated ions and having an approximately equal densities of electrons and ions, the method comprising;

(a) determining whether the excessive stress level in the thin film can be changed from being excessive and towards zero stress by (i) adjusting the set process pressure at which the thin film is deposited on the substrate so as to be within a predetermined pressure process window between $10^{-3}$ to $10^{-9}$ Torr, or (ii) adjusting the set temperature of the substrate on which the thin film is deposited to be within a predetermined temperature process window between $-100°$ to $+800°$ C.;

(b) upon determining in step (a) that the excessive stress level in the thin film cannot be changed from being excessive and towards zero stress by adjusting the set process pressure and that the excessive stress level in the thin film cannot be changed from being excessive and towards zero stress by adjusting the temperature of the substrate, while maintaining the set process pressure, the set temperature of the substrate and the set ion gun voltage, increasing tensile stress in the thin film being deposited by decreasing the set ion gun current below a predetermined first current level above 2 amps or increasing compressive stress in the thin film being deposited by increasing the set ion gun current above a predetermined first current range, and then determining whether the stress in the thin film being deposited can be moved towards zero stress as the set ion gun current is varied within a predetermined ion gun current process window above 2 amps for varying the ion gun current;

c) upon determining that the stress in the thin film being deposited cannot be moved towards zero stress as the ion gun current is varied within the predetermined ion gun current process window, increasing, while maintaining the set ion gun current adjusted in step (b), the tensile stress in the thin film being deposited by decreasing the set ion gun voltage below a first voltage level or increasing compressive stress by increasing the set ion gun voltage above a second voltage level, and then determining whether the stress in the thin film being deposited can be moved towards zero stress as the ion gun voltage is varied within a predetermined ion gun voltage process window between 100 and 300 volts for varying the ion gun voltage;

(d) upon determining in step (c) that the thin film stress cannot be moved towards zero stress as the ion gun voltage is varied within the ion gun voltage process window, adjusting the set ion gun acceleration voltage to be within the predetermined ion gun voltage process window, and then repeating steps (a) to (c)

(e) upon determining a plurality of times that the thin film stress cannot be moved away from being excessive and towards zero stress as the ion gun current and voltage are varied within the predetermined ion gun current process window and within the predetermined ion gun voltage process window, respectively, while maintaining the set ion gun current adjusted in step (b) and the set ion gun voltage adjusted in step (c), adjusting the process pressure at which the thin film is deposited to be within the predetermined process pressure window and the temperature of the substrate on which the thin film is deposited to be within the substrate temperature process window; and (f) after performing step (e), repeating steps (b) to (e) to change the stress in the thin film from being excessive and towards zero stress, wherein the substrate temperature is lowered through cooling of the substrate using liquid nitrogen or chilled water and the substrate temperature is increased through heating the substrate with a resistive heater in contact with the substrate or by irradiation of the substrate from a source of infrared radiation or visible wavelengths.

22. The method of claim 19, wherein the stress in the thin film being deposited exceeds ±200 megapascals (MPa) and the predetermined pressure process window is from $10^{-3}$ to $10^{-9}$ Torr.

23. The method of claim 19, wherein adjusting the set pressure within the predetermined pressure process window to change the stress of the thin film towards the desired state of stress comprises:

when tensile stress in the thin film needs to be increased to change the stress in the thin film to below +200 MPa and towards zero stress, increasing the process pressure to change the stress in the thin film to below +200 MPa and towards zero stress, and when compressive stress in the thin film needs to be increased to change the stress in the thin film to above −200 MPa and towards zero stress, decreasing the process pressure to change the stress in the thin film to above −200 MPa and towards zero stress.

24. The method of claim 19, wherein the lower temperature in the predetermined temperature process window is below 0 degrees C. and the higher temperature in the predetermined temperature process window is greater than 250 degrees C.

25. The method of claim 19, wherein the predetermined temperature process window comprises a range of temperatures from −100 C to +800 C.

26. The method of claim 19, wherein upon determining that adjusting the set substrate temperature within the predetermined temperature process window will change the stress of the thin film towards the desired state of stress, adjusting the substrate temperature within the predetermined temperature process window to change the thin film stress level towards the desired state of stress, wherein adjusting the substrate temperature within the predetermined temperature process window comprises:

when the tensile stress in the thin film needs to be increased to change the thin film stress level to below +200 MPa and towards zero stress, decreasing the substrate temperature to at least below 20° C. to change the thin film stress level to below +200 MPa and towards zero stress, and when the compressive stress in the thin film needs to be increased to change the stress in the thin film to above −200 MPa and towards zero stress, increasing the substrate temperature to at least above 20° C. to change the stress in the thin film to above −200 MPa and towards zero stress.

27. The method of claim 20, wherein the predetermined first current level is below 2 amps, the predetermined first current range is above 2-12 amps and the predetermined ion gun current process window is within a range of 2-12 amps.

28. The method of claim 20, wherein adjusting ion source current to change the thin film stress level from being excessive and the desired state of stress comprises:
when the tensile stress in the thin film needs to be increased to change the thin film stress level to below +200 MPa and towards zero stress, decreasing the ion source current to at least below 2 amps to change the thin film stress level to below +200 MPa and towards zero stress, and
when the compressive stress in the thin film needs to be increased to change the stress in the thin film to above −200 MPa and towards zero stress, increasing the ion source current to at least above 2 amps to change the stress in the thin film to above −200 MPa and towards zero stress.

29. The method of claim 20, wherein the predetermined ion gun voltage process window is within a range of 100 and 300 volts.

30. The method of claim 20, wherein ion source voltage is adjusted to change the thin film stress level towards the desired state of stress and comprises, when the tensile stress in the thin film needs to be increased to change the thin film stress level to below +200 MPa and towards zero stress, decreasing the ion source voltage to at least below 200 volts to change the thin film stress level to below +200 MPa and towards zero stress, and when the compressive stress in the thin film needs to be increased to change the stress in the thin film to above −200 MPa and towards zero stress, increasing the ion source voltage to at least above 200 volts to change the stress in the thin film to above −200 MPa and towards zero stress.

31. The method of claim 19, wherein the thin film is being deposited on the substrate by sputtering physical vapor deposition and the method further comprises:
(a) adjusting target sputter power density for the target sputter power density to be within a predetermined target power density process window for varying the target power density to thereby adjust thin film stress to not be excessive and moved towards the desired state of stress and/or thin film conformality to not be in one or more of the undesired states, and then determining if the target sputter power density is or is not within the predetermined target power density process window,
(b) when a determination has been made that the target sputter power density is within the target power density process window, then while not changing all other process parameters, adjusting sputter power density accordingly within the predetermined target power density process window so that the thin film stress is changed to not be excessive and moved towards the desired state of stress,
(c) when a determination has been made that the adjusted target sputter power density is not within the predetermined target power density process window, then while not changing target sputter power density, adjusting sputter signal frequency in an attempt for the sputter signal frequency to be within a predetermined sputter signal frequency process window for varying the sputter signal frequency to thereby adjust thin film stress to not be excessive and moved towards the desired state of stress and/or conformality to not be in one or more of the undesired states, and then determining if the sputter signal frequency is or is not within the predetermined sputter signal frequency process window,
(d) when a determination has been made that the sputter signal frequency is within the predetermined sputter signal frequency process window, while not changing all other process parameters, adjusting sputter signal frequency accordingly for the sputter signal frequency to be within the predetermined sputter signal frequency process window so that the thin film stress is changed to not be excessive and moved towards the desired state of stress,
(e) when a determination has been made that the sputter signal frequency is not within the predetermined sputter signal frequency process window, then while not changing target sputter power density and sputter signal frequency, adjusting sputter signal duty cycle for the sputter signal duty cycle to be within a predetermined sputter signal duty cycle process window to thereby adjust film stress or conformality or film stress and conformality, and then determining if the sputter signal duty cycle is within a predetermined sputter signal duty cycle process window for varying the sputter signal duty cycle,
(f) when a determination has been made that the sputter signal duty cycle is within the predetermined sputter signal duty cycle process window, then while not changing all other parameters, adjusting sputter signal duty cycle accordingly within the predetermined sputter signal duty cycle process window so that the thin film stress is changed to not be excessive and moved towards the desired state of stress,
(g) when a determination has been made that the sputter signal duty cycle is not within the predetermined sputter signal duty cycle process window, then repeating steps (c) to (h) until a determination is made that the sputter signal duty cycle is within the predetermined sputter signal duty cycle process window so that the thin film stress is changed to not be excessive and moved towards the desired state of stress or not within the predetermined sputter signal duty cycle process window a plurality of times, and
(h) when a determination has been made a plurality of times that the sputter signal duty cycle is not within the predetermined sputter signal duty cycle process window, then determining whether or not target sputter power density, sputter signal frequency, and sputter signal duty cycle limits have been reached on sputter power supply, and
(i) when a determination is made that target sputter power density, sputter signal frequency, and sputter signal duty cycle limits have been reached on sputter power supply, then determining if the process pressure or substrate temperature or process pressure and substrate temperature can be further adjusted to change the thin film stress level from being excessive and towards the desired state of stress,
(j) when a determination has been made that the process pressure and/or substrate temperature can be further adjusted, then adjusting the process pressure to be within the predetermined pressure process window and/or the substrate temperature to be within the predetermined temperature process window, and then repeating steps (a) to ( ) until a determination has been made that either the thin film stress level is changed from being excessive and towards the desired state of stress, or not, and then a determination has been made that the process pressure and/or the substrate temperature cannot be further adjusted, such that other physical vapor deposition techniques to control the thin film stress should be explored, (k) when a determination has been made that the process pressure, substrate temperature or process pressure and substrate temperature cannot be further adjusted, using another physical vapor deposition technique to control the thin film stress.

32. The method of claim 31, wherein the predetermined target power density process window is from 2 to 10 W/cm$^2$, the predetermined sputter signal frequency process window is from 0 to 13.56 MHz, and the predetermined sputter signal duty cycle process window is from 5 to 100%.

33. The method of claim 31, wherein the target sputter power density being adjusted to change the thin film stress level from being excessive and towards the desired state of stress comprises:

when the tensile stress in the thin film needs to be increased to change the thin film stress level to below +200 MPa and towards zero stress, decreasing the target sputter power density to change the thin film stress level to below +200 MPa and towards zero stress, and when the compressive stress in the thin film needs to be increased to change the stress in the thin film to above −200 MPa and towards zero stress, increasing the target sputter power density to change the stress in the thin film to above −200 MPa and towards zero stress.

34. The method of claim 21, wherein the predetermined first current level is below 2 amps, the predetermined first current range is above 2 to 12 amps and the predetermined ion gun current process window is within a range of 2 to 12 amps.

35. The method of claim 21, wherein adjusting ion source current to change the thin film stress level towards the desired state of stress comprises:

when the tensile stress in the thin film needs to be increased to change the thin film stress level to below +200 MPa and towards zero stress, decreasing the ion source current to at least below 2 amps to change the thin film stress level to below +200 MPa and towards zero stress, and when the compressive stress in the thin film needs to be increased to change the stress in the thin film to above −200 MPa and towards zero stress, increasing the ion source current to at least above 2 amps to change the stress in the thin film to above −200 MPa and towards zero stress.

36. The method of claim 21, wherein the predetermined ion gun voltage process window is within a range of 100 to 300 volts.

37. The method of claim 21, wherein ion source voltage is adjusted to change the thin film stress level from being excessive and towards the desired state of stress and comprises:

when the tensile stress in the thin film needs to be increased to change the thin film stress level to below +200 MPa and towards zero stress, decreasing the ion source voltage to at least below 200 volts to change the thin film stress level to below +200 MPa and towards zero stress, and when the compressive stress in the thin film needs to be increased to change the stress in the thin film to above −200 MPa and towards zero stress, increasing the ion source voltage to at least above 200 volts to change the stress in the thin film to above −200 MPa and towards zero stress.

38. The method of claim 21, wherein the method is incorporated into a set of coded instructions and decision points that constitute an algorithm, and wherein the algorithm allows certain inputs that are based on desired material properties and a set of PVD deposition tool settings to be varied; and using these inputs, the algorithm provides a user with directions on which process parameters to adjust in a specific hierarchy of process parameters, with the process parameters being adjusted according to their standing in the hierarchy, until the desired process setting for the desired stress state in the thin film material is thereby obtained; and as a user performs a cycle of adjusting process parameters in a hierarchy dictated by the algorithm, the user inputs new results of the process results into the algorithm; and the cycle being repeated until the process settings of the parameters converge onto a set of process parameters providing the desired state of stress for the thin film.

39. A closed-loop feedback control method of controlling stress in a thin film with an excessive stress level while the thin film is being deposited over a pre-existing topography of a substrate by sputtering physical vapor deposition ("PVD") on a substrate to fabricate a micro-electro-mechanical system ("MEMS"), a nano-electro-mechanical system ("NEMS"), a photonic device, a micro-device or a nano-device on the substrate, the sputtering PVD process includes using an gridless ion gun to bombard the thin film with ions during the deposition of the thin film on the substrate and depositing the thin film on the substrate at a set process pressure, a set temperature of the substrate, a set target sputter power density, a set sputter signal frequency and a set sputter signal duty cycle, the stress in the thin film being deposited being determined during the deposition of the thin film based on measurements received from a stress monitoring system during the deposition of the thin film over the pre-existing topography of the substrate, wherein the gridless ion gun configured to generate ions with an accelerating potential difference produced by electrons from cathode-neutralizer entering a magnetic field setup by permanent magnets in a source, and wherein acceleration of the ions takes place in a quasi-neutral plasma formed by gas ionized by the generated ions and having an approximately equal densities of electrons and ions, the method comprising;

(a) determining whether the excessive stress level in the thin film can be changed from being excessive and towards a desired state of stress by (i) adjusting the set process pressure at which the thin film is deposited on the substrate so as to be within a predetermined pressure process window between $10^{-3}$ to $10^{-9}$ Torr, or (ii) adjusting the set temperature of the substrate on which the thin film is deposited to be within a predetermined temperature process window;

(b) upon determining in step (a) that the excessive stress level in the thin film cannot be changed from being excessive and towards the desired state of stress by adjusting the set process pressure and that the excessive stress level in the thin film cannot be changed from being excessive and towards the desired state of stress by adjusting the temperature of the substrate, while maintaining the set process pressure and the set temperature of the substrate, adjusting the set target sputter power density within a predetermined target power density process window for varying the target power density to thereby adjust the thin film stress towards the desired state of stress and/or thin film conformality to not be in one or more of the undesired states, and then determining whether adjusting the target sputter power density within the predetermined target power density process window will keep the stress in the thin film to be excessive and/or make the thin film conformality to be in one or more of the undesired states;

c) upon determining in step (b) that adjusting the target sputter power density within the predetermined target power density process window will keep the stress in the thin film to be excessive and/or will make the thin film conformality to be in one or more of the undesired states, while maintaining the set target sputter power density adjusted in step (b), adjusting the set sputter signal frequency within a predetermined sputter signal frequency process window for varying the sputter signal frequency to thereby adjust the thin film stress towards the desired state of stress and/or thin film conformality over the pre-existing topography of the substrate to not be in one or more of the undesired states, and then determining whether adjusting the sputter signal frequency within the predetermined sputter signal frequency process window will keep the stress in the thin film to be excessive and/or make the thin film conformality over a pre-existing topography of the substrate to be in one or more of the undesired states;

(d) upon determining in step (c) that adjusting the sputter signal frequency within the predetermined sputter signal frequency process window will keep the stress in the thin film to be excessive and/or will make the thin film conformality over the pre-existing topography of the substrate to be in one or more of the undesired states, then while maintaining the set target sputter power density adjusted in step (b) and set sputter signal frequency adjusted in step (c), adjusting sputter signal duty cycle within a predetermined sputter signal duty cycle process window for varying the sputter signal duty cycle to thereby adjust film stress towards the desired state of stress and/or thin film conformality over the pre-existing topography of the substrate to not be in one or more of the undesired states, and then determining whether adjusting the sputter signal duty cycle within the predetermined sputter signal duty cycle process window for varying the sputter signal duty cycle will keep the stress in the thin film to be excessive and/or make the thin film conformality over the pre-existing topography of the substrate to be in one or more of the undesired states, (e) upon determining that adjusting the sputter signal duty cycle within the predetermined sputter signal duty cycle process window will keep the stress in the thin film to be excessive and/or make the thin film conformality over the pre-existing topography of the substrate to be in one or more of the undesired states, then repeating steps (b) to (d) so that the thin film stress is moved towards the desired state of stress;

(f) determining whether limits for adjusting the set target sputter power density, the set sputter signal frequency, and the set sputter signal duty cycle have been reached on sputter power supply;

(g) upon determining that the limits for adjusting the set target sputter power density, the set sputter signal frequency, and the set sputter signal duty cycle limits have been reached on the sputter power supply, determining if the set process pressure and/or the set substrate temperature can be further adjusted to change the thin film stress level from being excessive and towards the desired state of stress; and (h) upon determining that the set process pressure and/or the set substrate temperature can be further adjusted to reduce the stress of the thin film towards the desired state of stress, adjusting the set process pressure at which the thin film is deposited to be within the predetermined process pressure window and/or the set temperature of the substrate on which the thin film is deposited to be within the predetermined temperature process window, and then repeating steps (b) to (d) to change the stress in the thin film from being excessive and towards the desired state of stress, wherein the substrate temperature is lowered through cooling of the substrate using liquid nitrogen or chilled water and the substrate temperature is increased through heating the substrate with a resistive heater in contact with the substrate or by irradiation of the substrate from a source of infrared radiation or visible wavelengths.

40. The method of claim 39, wherein the predetermined target power density process window is from 2 to 10 W/cm$^2$, predetermined sputter signal frequency process window is from 0 to 13.56 MHz, and the predetermined sputter signal duty cycle process window is from 5 to 100%.

41. The method of claim 39, wherein the target sputter power density is adjusted to change the thin film stress level from being excessive and towards the desired state of stress and comprises:

when the tensile stress in the thin film needs to be increased to change the thin film stress level to below +200 MPa and towards zero stress, decreasing the target sputter power density to change the thin film stress level to below +200 MPa and towards zero stress, and when the compressive stress in the thin film needs to be increased to change the stress in the thin film to above −200 MPa and towards zero stress, increasing the target sputter power density to change the stress in the thin film to above −200 MPa and towards zero stress.

42. The method of claim 39, wherein the predetermined temperature process window is from −100° to +800° C.

43. The method of claim 39, wherein the method is incorporated into a set of coded instructions and decision points that constitute an algorithm, and wherein the algorithm allows certain inputs that are based on desired material properties and a set of PVD deposition tool settings to be varied; and using these inputs, the algorithm provides a user with directions on which process parameters to adjust in a specific hierarchy, with the most important parameter adjusted, the second most important parameter adjusted next, and so on, until the desired process setting for the desired stress state in the thin film material is thereby obtained; and as a user performs a cycle of adjusting process parameters in a hierarchy dictated by the algorithm, the user inputs new results of the process results into the algorithm; and the cycle being repeated until the process settings of the parameters converge onto a set of process parameters providing the desired state of stress for the thin film.

44. The method of claim 19, wherein the method is incorporated into a set of coded instructions and decision points that constitute an algorithm, and wherein the algorithm allows certain inputs that are based on desired material properties and a set of PVD deposition tool settings to be varied; and using these inputs, the algorithm provides a user with directions on which process parameters to adjust in a specific hierarchy, with the most important parameter adjusted, the second most important parameter adjusted next, and so on, until the desired process setting for the desired stress state in the thin film material is thereby obtained; and as a user performs a cycle of adjusting process parameters in a hierarchy dictated by the algorithm, the user inputs new results of the process results into the algorithm; and the cycle being repeated until the process settings of the parameters converge onto a set of process parameters providing the desired state of stress for the thin film.

45. The method of claim 19, wherein the method employs a closed-loop control system and a software algorithm that is a set of coded instructions and decision points; and wherein the algorithm allows certain inputs that are based on desired material properties and a set of PVD deposition tool settings that can be varied;

the closed-loop control system includes a stress monitoring system that measures the stress in the thin film as it is being deposited; and data from the stress monitoring system is fed back through a communication line into the closed-loop controller, which takes stress measurement data and, based on the algorithm, provides electrical signals through a communication line to an ion beam source, so as to adjust ion beam current and voltage to values that more properly meet stress state values that are desired; and the closed-loop controller also being connected to sensors for measuring both process chamber pressure, substrate temperature and deposition rate, and wherein the process chamber pressure, substrate temperature and deposition rate measurements are collectively taken together and used in the algorithm to automatically adjust in real time process parameters so as to obtain a pre-determined state of stress in thin films deposited using PVD.

46. The method of claim 21, wherein the method employs a closed-loop control system and a software algorithm that is a set of coded instructions and decision points; and wherein the algorithm allows certain inputs that are based on desired material properties and a set of PVD deposition tool settings that can be varied;

the closed-loop control system includes a stress monitoring system that measures the stress in the thin film as it is being deposited; and data from the stress monitoring system is fed back through a communication line into the closed-loop controller, which takes stress measurement data and, based on the algorithm, provides electrical signals through a communication line to an ion beam source, so as to adjust ion beam current and voltage to values that more properly meet stress state values that are desired; and the closed-loop controller also being connected to sensors for measuring both process chamber pressure, substrate temperature and deposition rate, and wherein the process chamber pressure, substrate temperature and deposition rate measurements are collectively taken together and used in the algorithm to automatically adjust in real time process parameters so as to obtain a pre-determined state of stress in thin films deposited using PVD.

47. The method of claim 39, wherein the method employs a closed-loop control system and a software algorithm that is a set of coded instructions and decision points; and wherein the algorithm allows certain inputs that are based on desired material properties and a set of PVD deposition tool settings that can be varied;

the closed-loop control system includes a stress monitoring system that measures the stress in the thin film as it is being deposited; and data from the stress monitoring system is fed back through a communication line into the closed-loop controller, which takes stress measurement data and, based on the algorithm, provides electrical signals through a communication line to an ion beam source, so as to adjust ion beam current and voltage to values that more properly meet stress state values that are desired; and the closed-loop controller also being connected to sensors for measuring both process chamber pressure, substrate temperature and deposition rate, and wherein the process chamber pressure, substrate temperature and deposition rate measurements are collectively taken together and used in the algorithm to automatically adjust in real time process parameters so as to obtain a pre-determined state of stress in thin films deposited using PVD.

48. The method of claim 19, wherein the thin film being deposited on the substrate is a layer of a multilayer thin film structure.

49. The method of claim 19, wherein the determination includes determining whether adjusting the set pressure within the predetermined pressure process window will change the thin film morphology and the thin film conformality over topology of the substrate such that the performance requirement of the thin film which depends on the morphology of the thin film and conformality of the thin film is not satisfied.

50. The method of claim 19, wherein the desired state of stress is zero stress in the thin film.

51. The method of claim 19, wherein the thin film being deposited on the substrate is a layer of a multilayer thin film structure including at least one sacrificial thin film layer onto which the thin film layer is deposited, and wherein the method further includes etching the thin film structure to form a pattern at least a portion of which is attached to the substrate after the etching and removal of the sacrificial thin film layer.

52. The method of claim 19, wherein the thin film being deposited on the substrate is an amorphous thin film.

53. A method of controlling stress in a thin film with an excessive stress level while the thin film is being deposited by physical vapor deposition ("PVD") on a substrate to fabricate micro-electro-mechanical systems ("MEMS"), nano-electro-mechanical systems ("NEMS"), a photonic device, micro-device or nano-device on the substrate, the method comprising:

a) determining whether or not a morphology or conformality or morphology and conformality of the thin film being deposited is/are such that a system or device fabricated with the thin film will function as designed, b) based on determining that the morphology or conformality or morphology and conformality of the thin film being deposited is/are such that the system or device being fabricated will function as designed, then determining whether or not adjusting a pressure at which the thin film is deposited will change the thin film's morphology or conformality or morphology and conformality to one or more states, wherein the system or device fabricated with the changed thin film will not function as designed, c) based on determining that adjusting the pressure at which the thin film is deposited will not change the thin film's morphology or conformality or morphology and conformality to the one or more states wherein the system or device fabricated with the thin film will not function as designed, then adjusting the deposition pressure over a predetermined pressure process window to change the thin film stress level from being excessive and towards a level of zero stress, d) determining whether or not the thin film stress level can be controlled so as to not be excessive, while maintaining the process pressure within the predetermined pressure process window, and based on determining that the thin film stress level can be controlled so as to not be excessive, then adjusting the process pressure accordingly within the predetermined pressure process window to thereby change the thin film stress level from being excessive and towards a level of zero stress, e) based on determining that the thin film stress level cannot be controlled so as to not be excessive while the process pressure is maintained within the predetermined pressure process window, or based on determining that adjusting the process pressure will change the thin film's morphology or conformality or morphology and conformality to the one or more states wherein the system or device fabricated with the thin film will not function as designed, determining whether a higher or lower substrate temperature can be used to change the thin film stress level from being excessive and towards a level of zero stress, f) based on determining that the higher or lower substrate temperature cannot be used, while making no further changes in the process pressure or in the substrate temperature, using ion bombardment of the thin film by a gridless ion gun to reduce energy in the thin film and thereby the stress in the thin film, wherein the gridless ion gun configured to generate ions with an accelerating potential difference produced by electrons from cathode-neutralizer entering a magnetic field setup by permanent magnets in a source, and wherein acceleration of the ions takes place in a quasi-neutral plasma formed by gas ionized by the generated ions and having an approximately equal densities of electrons and ions, g) based on determining that the higher or lower substrate temperature can be used, determining whether adjusting the substrate temperature will change the thin film's morphology or conformality or morphology and conformality to the one or more states wherein the system or device fabricated with the thin film will not function as designed, h) based on determining that a higher or lower substrate temperature will change the thin film's morphology or conformality or morphology and conformality to the one or more states wherein the system or device fabricated with the changed thin film will not function as designed, using ion bombardment of the thin film by the ion gun, while making no further changes in the process pressure or in the substrate temperature, to reduce the energy in the thin film and thereby the stress in the thin film, i) based on determining that a higher or lower substrate temperature will not change the thin film's morphology, or conformality or morphology and conformality to the one or more states wherein the system or device fabricated with the thin film will not function as designed, and based on determining that increasing tensile stress in the thin film by decreasing substrate temperature, or increasing compressive stress in the thin by increasing substrate temperature enables the thin film stress level to be changed from being excessive and towards a level of zero stress, then adjusting the substrate temperature accordingly within a predetermined temperature process window for varying the process temperature to thereby change the thin film stress level from being excessive and towards the level of zero stress, and j) based on determining that adjusting the substrate temperature within a predetermined temperature process window for varying the substrate temperature does not result in a change in the thin film stress level from being excessive and towards the level of zero stress, using ion bombardment of the thin film by the ion gun, while making no further changes in the process pressure or in the substrate temperature, to reduce the energy in the thin film and thereby the stress in the thin film from being excessive and towards the level of zero stress, wherein the substrate temperature is lowered through cooling of the substrate using liquid nitrogen or chilled water and the substrate temperature is increased through heating the substrate with a resistive heater in contact with the substrate or by irradiation of the substrate from a source of infrared radiation or visible wavelengths.

54. The method of claim 53, wherein the predetermined pressure process window is from $10^{-3}$ to $10^{-9}$ Torr and the predetermined temperature process window is from $-100°$ to $+800°$ C.

55. The method of claim 53, wherein adjusting the deposition pressure within the predetermined pressure process window to change the thin film stress level from being excessive and towards zero stress comprises, based on the tensile stress in the thin film needing to be increased to change the thin film stress level to below +200 MPa and towards zero stress, increasing the process pressure to so change the stress level in the thin film, and based on the compressive stress in the thin film needing to be increased to change the stress in the thin film to above −200 MPa and towards zero stress, decreasing the process pressure to so change the stress in the thin film.

56. The method of claim 53, wherein adjusting the substrate temperature within the predetermined temperature process window to change the thin film stress level from being excessive and towards zero stress comprises, based on the tensile stress in the thin film needing to be increased to change the thin film stress level to below +200 MPa and towards zero stress, decreasing the substrate temperature to at least below 20° C. to so change the stress level in the thin film, and based on the compressive stress in the thin film needing to be increased to change the stress in the thin film to above −200 MPa and towards zero stress, increasing the substrate temperature to at least above 20° C. to so change the stress in the thin film.

57. The method of claim 53 further comprising, the thin film being deposited on the substrate by evaporated physical vapor deposition includes:
- k) based on either (1) the ion gun already being used to bombard the thin film with ions, increasing tensile stress in the thin film being deposited by decreasing ion gun current below a predetermined first current level, or increasing compressive stress in the thin film being deposited by increasing the ion gun current above a predetermined first current range, or (2) the ion gun not already being used, increasing tensile stress in the thin film being deposited by not using the ion gun, and then (3) determining if the stress in the thin film being deposited can be moved towards a level of zero stress as the ion gun current is varied within a predetermined ion gun current process window for varying the ion gun current,
- l) based on a determination that the stress in the thin film being deposited can be moved towards a level of zero stress as the ion gun current is varied within the predetermined ion gun current process window, adjusting, while not changing ion gun's acceleration voltage, the ion gun current accordingly so that the thin film stress is changed to not be excessive and moved towards a level of zero stress,
- m) based on a determination that the stress in the thin film being deposited cannot be moved towards a level of zero stress as the ion gun current is varied within the ion gun current process window, and based on either (1) the ion gun already being used, increasing tensile stress in the thin film being deposited by decreasing ion gun voltage below a first voltage level or increasing compressive stress by increasing ion gun voltage above a second voltage level, or (2) the ion gun not already being used, increasing tensile stress by not using the ion gun, and then (3) determining if the stress in the thin film being deposited can be moved towards a level of zero stress as the ion gun voltage is varied within a predetermined ion gun voltage process window for varying the ion gun voltage,
- n) based on a determination that the thin film stress can be moved towards a level of zero stress as the ion gun voltage is varied within the predetermined ion gun voltage process window, while not changing the ion gun's current, then adjusting the ion gun acceleration voltage accordingly within the predetermined ion gun voltage process window so that the thin film stress is changed to not be excessive and moved towards a level of zero stress,
- o) based on a determination that the thin film stress cannot be moved towards a level of zero stress as the ion gun voltage is varied within the ion gun voltage process window, adjusting and fixing the ion gun acceleration voltage to be within the predetermined ion gun voltage process window, and then repeating steps (k) to (p) until a determination has been made that the thin film stress is either moved away from being excessive and towards a level of zero stress or not moved away from being excessive and towards the level of zero stress a plurality of times,
- p) based a plurality of determination being made that the thin film stress cannot be moved away from being excessive and towards a level of zero stress as the ion gun current and/or voltage is/are varied within the predetermined ion gun current process window and within the predetermined ion gun voltage process window, respectively, determining if the ion gun's current and/or voltage limits have been reached, and
- q) based on a determination being made that the ion gun's current and/or voltage limits have been reached, determining if the process pressure and/or substrate temperature can be further adjusted to change the thin film stress level from being excessive and towards a level of zero stress,
- r) based on a determination being been made that the process pressure or substrate temperature or process pressure and substrate temperature can be further adjusted, adjusting the process pressure to be within the predetermined pressure process window, and/or the substrate temperature to be within the predetermined temperature process window, and then repeating steps (m) to (p) until either a determination has been made that the thin film stress level is changed from being excessive and towards a level of zero stress, or not, and then a determination has been made that the process pressure and/or the substrate temperature cannot be further adjusted, such that other physical vapor deposition techniques to control the thin film stress should be explored, and
- s) based on a determination being made that the process pressure, substrate temperature or process pressure and substrate temperature cannot be further adjusted, exploring other physical vapor deposition techniques to control the thin film stress.

58. The method of claim 57, wherein the predetermined first current level is below 2 amps, the predetermined first current range is above 2-12 amps and the predetermined ion gun current process window is within a range of 2-12 amps.

59. The method of claim 57, wherein adjusting ion source current to change the thin film stress level from being excessive and towards zero stress comprises, if the tensile stress in the thin film needs to be increased to change the thin film stress level to below +200 MPa and towards zero stress, decreasing the ion source current to at least below 2 amps to so change the stress level in the thin film, and if the compressive stress in the thin film needs to be increased to change the stress in the thin film to above −200 MPa and towards zero stress, increasing the ion source current to at least above 2 amps to so change the stress in the thin film.

60. The method of claim 57, wherein the predetermined ion gun voltage process window is within a range of 100-300 volts.

61. The method of claim 53, wherein ion source voltage is adjusted to change the thin film stress level from being excessive and towards zero stress comprises, if the tensile stress in the thin film needs to be increased to change the thin film stress level to below +200 MPa and towards zero stress, decreasing the ion source voltage to at least below 200 volts so change the stress level in the thin film, and if the compressive stress in the thin film needs to be increased to change the stress in the thin film to above −200 MPa and towards zero stress, increasing the ion source voltage to at least above 200 volts to so change the stress in the thin film.

62. The method of claim 53 further comprising, where the thin film is being deposited on the substrate by sputtering physical vapor deposition includes:
- k) adjusting target sputter power density in an attempt for it to be within a predetermined target power density process window for varying the target power density to thereby adjust thin film stress to not be excessive and moved towards a level of zero stress and/or thin film conformality to not be in one or more of the undesired states, and then determining if the target sputter power density is or is not within the predetermined target power density process window, l) based on a determination being made that the target sputter power density is within the target power density process window, then while not changing all other process parameters, adjusting sputter power density accordingly within the predetermined target power density process window so that the thin film stress is changed to not be excessive and moved towards a level of zero stress, m) based on a determination being made that the adjusted target sputter power density is not within the predetermined target power density process window, then while not changing target sputter power density, adjusting sputter signal frequency in an attempt for it to be within a predetermined sputter signal frequency process window for varying the sputter signal frequency to thereby adjust thin film stress to not be excessive and moved towards a level of zero stress and/or conformality to not be in one or more of the undesired states, and then determining if the sputter signal frequency is or is not within the predetermined sputter signal frequency process window, n) based on a determination being made that the sputter signal frequency is within the predetermined sputter signal frequency process window, while not changing all other process parameters, adjusting sputter signal frequency accordingly in an attempt for it to be within the predetermined sputter signal frequency process window so that the thin film stress is changed to not be excessive and moved towards a level of zero stress, o) based on a determination being made that the sputter signal frequency is not within the predetermined sputter signal frequency process window, then while not changing target sputter power density and sputter signal frequency, adjusting sputter signal duty cycle in an attempt for it to be within a predetermined sputter signal duty cycle process window to thereby adjust film stress or conformality or film stress and conformality, and then determining if the sputter signal duty cycle is within a predetermined sputter signal duty cycle process window for varying the sputter signal duty cycle, p) based on a determination being made that the sputter signal duty cycle is within the predetermined sputter signal duty cycle process window, then while not changing all other parameters, adjusting sputter signal duty cycle accordingly within the predetermined sputter signal duty cycle process window so that the thin film stress is changed to not be excessive and moved towards a level of zero stress, q) based on a determination being made that the sputter signal duty cycle is not within the predetermined sputter signal duty cycle process window, then repeating steps (m) to (r) until a determination is made that the sputter signal duty cycle is within the predetermined sputter signal duty cycle process window so that the thin film stress is changed to not be excessive and moved towards a level of zero stress or not within the predetermined sputter signal duty cycle process window a plurality of times, and r) based on a determination being made that a plurality of times that the sputter signal duty cycle is not within the predetermined sputter signal duty cycle process window, then determining whether or not target sputter power density, sputter signal frequency, and sputter signal duty cycle limits have been reached on sputter power supply, and s) based on a determination being made that target sputter power density, sputter signal frequency, and sputter signal duty cycle limits have been reached on sputter power supply, then determining if the process pressure or substrate temperature or process pressure and substrate temperature can be further adjusted to change the thin film stress level from being excessive and towards a level of zero stress, t) based on a determination being made that the process pressure and/or substrate temperature can be further adjusted, then adjusting the process pressure to be within the predetermined pressure process window and/or the substrate temperature to be within the predetermined temperature process window, and then repeating steps (k) to (t) until a determination has been made that either the thin film stress level is changed from being excessive and towards a level of zero stress, or not, and then a determination has been made that the process pressure and/or the substrate temperature cannot be further adjusted, such that other physical vapor deposition techniques to control the thin film stress should be explored, u) based on a determination being made that the process pressure, substrate temperature or process pressure and substrate temperature cannot be further adjusted, exploring other physical vapor deposition techniques to control the thin film stress.

63. The method of claim 62, wherein the predetermined target power density process window is from 2 to 10 W/cm$^2$, the predetermined sputter signal frequency process window is from 0 to 13.56 MHz, and the predetermined sputter signal duty cycle process window is from 5 to 100%.

64. The method of claim 62, wherein the target sputter power density being adjusted to change the thin film stress level from being excessive and towards zero stress comprises, based on the tensile stress in the thin film needing to be increased to change the thin film stress level to below +200 MPa and towards zero stress, decreasing the target sputter power density so change the stress level in the thin film, and based on the compressive stress in the thin film needing to be increased to change the stress in the thin film to above −200 MPa and towards zero stress, increasing the target sputter power density to so change the stress in the thin film.

65. A method of controlling stress in a thin film with an excessive stress level while the thin film is being deposited by evaporated physical vapor deposition ("PVD") on a substrate to fabricate a micro-electro-mechanical systems ("MEMS"), nano-electro-mechanical systems ("NEMS"), photonic, micro-device or nano-device on the substrate, where the excessive stress level could not be changed from being excessive and towards a level of zero stress by adjusting (i) a process pressure at which the thin film is deposited on a substrate so as to be within a predetermined pressure process window, or (ii) a substrate temperature of the substrate on which the thin film is deposited to be within a predetermined temperature process window, and where a gridless ion gun is being used to bombard the thin film with ions, wherein the gridless ion gun configured to generate ions with an accelerating potential difference produced by electrons from cathode-neutralizer entering a magnetic field setup by permanent magnets in a source, and wherein acceleration of the ions takes place in a quasi-neutral plasma formed by gas ionized by the generated ions and having an approximately equal densities of electrons and ions, the method comprising:

a) increasing tensile stress in the thin film being deposited by decreasing ion gun current below a predetermined first current level, or increasing compressive stress in the thin film being deposited by increasing the ion gun current above a predetermined first current range, and then determining if the stress in the thin film being deposited can be moved towards a level of zero stress as the ion gun current is varied within a predetermined ion gun current process window for varying the ion gun current, b) based on determining that the stress in the thin film being deposited can be moved towards a level of zero stress as the ion gun current is varied within the predetermined ion gun current process window, while not changing ion gun's acceleration voltage, adjusting the ion gun current accordingly so that the thin film stress is changed to not be excessive and moved towards a level of zero stress, c) based on determining that the stress in the thin film being deposited cannot be moved towards a level of zero stress as the ion gun current is varied within the ion gun current process window, and increasing tensile stress in the thin film being deposited by decreasing ion gun voltage below a first voltage level or increasing compressive stress by increasing ion gun voltage above a second voltage level, and then determining if the stress in the thin film being deposited can be moved towards a level of zero stress as the ion gun voltage is varied within a predetermined ion gun voltage process window for varying the ion gun voltage, d) based on determining that the thin film stress can be moved towards a level of zero stress as the ion gun voltage is varied within the predetermined ion gun voltage process window, then while not changing the ion gun's current, adjusting the ion gun acceleration voltage accordingly within the predetermined ion gun voltage process window so that the thin film stress is changed to not be excessive and moved towards a level of zero stress, e) based on determining that the thin film stress cannot be moved towards a level of zero stress as the ion gun voltage is varied within the ion gun voltage process window, adjusting and fixing the ion gun acceleration voltage to be within the predetermined ion gun voltage process window, and then repeating steps (a) to (d) until a determination has been made that the thin film stress is either moved away from being excessive and towards the level of zero stress or not moved away from being excessive and towards the level of zero stress a plurality of times, f) based on determining a plurality of times that the thin film stress cannot be moved away from being excessive and towards the level of zero stress as the ion gun current and/or voltage is/are varied within the predetermined ion gun current process window and within the predetermined ion gun voltage process window, respectively, determining if the ion gun's current and/or voltage limits have been reached, and g) based on the current and/or voltage limits being reached on the ion gun, determining if the process pressure and/or the substrate temperature can be further adjusted to change the thin film stress level from being excessive and towards a level of zero stress, h) based on determining that the process pressure and/or the substrate temperature cannot be further adjusted, exploring other physical vapor deposition techniques to control the thin film stress, i) based on determining that the process pressure and/or the substrate temperature can be further adjusted, adjusting the process pressure at which the thin film is deposited to be within the predetermined process pressure window and/or the temperature of the substrate on which the thin film is deposited to be within the substrate temperature process window, then repeating steps (a) to (h) until either a determination has been made that the thin film stress level is changed from being excessive and towards a level of zero stress, or not, and then a determination has been made that the process pressure and/or the substrate temperature cannot be further adjusted, such that other physical vapor deposition techniques to control the thin film stress should be explored, wherein the substrate temperature is lowered through cooling of the substrate using liquid nitrogen or chilled water and the substrate temperature is increased through heating the substrate with a resistive heater in contact with the substrate or by irradiation of the substrate from a source of infrared radiation or visible wavelengths.

66. The method of claim 65, wherein the predetermined first current level is below 2 amps, the predetermined first current range is above 2 to 12 amps, the predetermined ion gun current process window is within a range of 2 to 12 amps, the predetermined ion gun voltage process window is within a range of 100 to 300 volts, and the predetermined pressure process window is from $10^{-3}$ to $10^{-9}$ Torr and the predetermined temperature process window is from $-100°$ to $+800°$ C.

67. The method of claim 65, wherein adjusting ion source current to change the thin film stress level from being excessive and towards zero stress comprises, based on the tensile stress in the thin film needing to be increased to change the thin film stress level to below +200 MPa and towards zero stress, decreasing the ion source current to at least below 2 amps to so change the stress level in the thin film, and based on the compressive stress in the thin film needing to be increased to change the stress in the thin film to above −200 Mpa and towards zero stress, increasing the ion source current to at least above 2 amps to so change the stress in the thin film.

68. The method of claim 65, wherein ion source voltage is adjusted to change the thin film stress level from being excessive and towards zero stress comprises, based on the thin film needing to be increased to change the thin film stress level to below +200 Mpa and towards zero stress, decreasing the ion source voltage to at least below 200 volts so change the stress level in the thin film, and based on the compressive stress in the thin film needing to be increased to change the stress in the thin film to above −200 Mpa and towards zero stress, increasing the ion source voltage to at least above 200 volts to so change the stress in the thin film.

69. A method of controlling stress in a thin film with an excessive stress level while the thin film is being deposited by sputtering evaporated physical vapor deposition ("PVD") on a substrate to fabricate a micro-electro-mechanical systems ("MEMS"), nano-electro-mechanical systems ("NEMS"), photonic, micro-device or nano-device on the substrate, where the excessive stress level could not be changed from being excessive and towards a level of zero stress by adjusting (i) a process pressure at which the thin film is deposited on a substrate so as to be within a predetermined pressure process window, or (ii) a substrate temperature of the substrate on which the thin film is deposited to be within a predetermined temperature process window, and where the thin film is being bombarded by ions from a gridless ion gun, wherein the gridless ion gun configured to generate ions with an accelerating potential difference produced by electrons from cathode-neutralizer entering a magnetic field setup by permanent magnets in a source, and wherein acceleration of the ions takes place in a quasi-neutral plasma formed by gas ionized by the generated ions and having an approximately equal densities of electrons and ions, the method comprising:

a) adjusting target sputter power density in an attempt for it to be within a predetermined target power density process window for varying the target power density to thereby adjust thin film stress to not be excessive and moved towards a level of zero stress and/or thin film conformality to not be in one or more of the undesired states, and then determining if the target sputter power density is or is not within the predetermined target power density process window, b) based on determining that the target sputter power density is within the target power density process window, then while not changing all other process parameters, adjusting sputter power density accordingly within the predetermined target power density process window so that the thin film stress is changed to not be excessive and moved towards a level of zero stress, c) based on determining that the adjusted target sputter power density is not within the predetermined target power density process window, then while not changing target sputter power density, adjusting sputter signal frequency in an attempt for it to be within a predetermined sputter signal frequency process window for varying the sputter signal frequency to thereby adjust thin film stress to not be excessive and moved towards a level of zero stress and/or thin film conformality to not be in one or more of the undesired states, and then determining if the sputter signal frequency is or is not within the predetermined sputter signal frequency process window, d) based on determining that the sputter signal frequency is within the sputter signal frequency process window, then while not changing all other process parameters, adjusting sputter signal frequency accordingly within the predetermined sputter signal frequency process window so that the thin film stress is changed to not be excessive and moved towards a level of zero stress, e) based on determining that the sputter signal frequency is not within the predetermined sputter signal frequency process window, then while not changing target sputter power density and sputter signal frequency, adjusting sputter signal duty cycle in an attempt for it to be within a predetermined sputter signal duty cycle process window for varying the sputter signal duty cycle to thereby adjust film stress to not be excessive and moved towards a level of zero stress and/or thin film conformality to not be in one or more of the undesired states, and then determining if the sputter signal duty cycle is within a predetermined sputter signal duty cycle process window for varying the sputter signal duty cycle, f) based on determining that the sputter signal duty cycle is within the predetermined sputter signal duty cycle process window, then while not changing all other parameters, adjusting sputter signal duty cycle accordingly within the predetermined sputter signal duty cycle process window so that the thin film stress is changed to not be excessive and moved towards a level of zero stress, g) based on determining that the sputter signal duty cycle is not within the predetermined sputter signal duty cycle process window, then repeating steps (a) to (e) until the sputter signal duty cycle is within the predetermined sputter signal duty cycle process window so that the thin film stress is changed to not be excessive and moved towards a level of zero stress or not within the predetermined sputter signal duty cycle process window a plurality of times, and h) based on determining a plurality of times that the sputter signal duty cycle is not within the predetermined sputter signal duty cycle process window, then determining whether or not target sputter power density, sputter signal frequency, and sputter signal duty cycle limits have been reached on sputter power supply, and i) based on determining that target sputter power density, sputter signal frequency, and sputter signal duty cycle limits have been reached on sputter power supply, then determining if the process pressure and/or the substrate temperature can be further adjusted to change the thin film stress level from being excessive and towards a level of zero stress, j) based on determining that the process pressure and/or the substrate temperature cannot be further adjusted, exploring other physical vapor deposition techniques to control the thin film stress, k) based on determining that the process pressure and/or the substrate temperature can be further adjusted, adjusting the process pressure at which the thin film is deposited to be within the predetermined process pressure window and/or the temperature of the substrate on which the thin film is deposited to be within the substrate temperature process window, then repeating steps (a) to (j) until a determination has been made that either the thin film stress level is changed from being excessive and towards a level of zero stress, or not, and a determination has been made that the process pressure and/or the substrate temperature cannot be further adjusted, such that other physical vapor deposition techniques to control the thin film stress should be explored, wherein the substrate temperature is lowered through cooling of the substrate using liquid nitrogen or chilled water and the substrate temperature is increased through heating the substrate with a resistive heater in contact with the substrate or by irradiation of the substrate from a source of infrared radiation or visible wavelengths.

70. The method of claim 69, wherein the predetermined target power density process window is from 2 to 10 W/cm$^2$, the predetermined sputter signal frequency process window is from 0 to 13.56 MHz, the predetermined sputter signal duty cycle process window is from 5 to 100%, and the predetermined pressure process window is from $10^{-3}$ to $10^{-9}$ Torr and the predetermined temperature process window is from −100° to +800° C.

71. The method of claim 69, wherein the target sputter power density is adjusted to change the thin film stress level from being excessive and towards zero stress comprises, if tensile stress in the thin film needs to be increased to change the thin film stress level to below +200 MPa and towards zero stress, decreasing the target sputter power density so change the stress level in the thin film, and if compressive stress in the thin film needs to be increased to change the stress in the thin film to above −200 MPa and towards zero stress, increasing the target sputter power density to so change the stress in the thin film.

72. The method of claim 53, wherein the method is incorporated into a set of coded instructions and decision points that constitute an algorithm, and
- wherein the algorithm allows certain inputs that are based on desired material properties and a set of PVD deposition tool settings to be varied; and
- using these inputs, the algorithm provides a user with directions on which process parameters to adjust in a specific hierarchy of process parameters, with the process parameters being adjusted according to their standing in the hierarchy, until the desired process setting for a desired stress state in the thin film is thereby obtained; and
- as a user performs a cycle of adjusting process parameters in a hierarchy dictated by the algorithm, the user inputs new results of the process results into the algorithm; and
- the cycle being repeated until the process settings of the parameters converge onto a set of process parameters providing the desired state of stress for the thin film.

73. The method of claim 53, wherein the method employs a closed-loop control system and a software algorithm that is a set of coded instructions and decision points; and wherein
- the algorithm allows certain inputs that are based on desired material properties and a set of PVD deposition tool settings that can be varied;
- the closed-loop control system includes a stress monitoring system that measures the stress in the thin film as it is being deposited; and
- data from the stress monitoring system is fed back through a communication line into the closed-loop controller, which takes stress measurement data and, based on the algorithm, provides electrical signals through a communication line to an ion beam source, so as to adjust ion beam current and voltage to values that more properly meet a stress state values that are desired; and
- the closed-loop controller also being connected to sensors for measuring both process chamber pressure, substrate temperature and deposition rate, and
- wherein the process chamber pressure, substrate temperature and deposition rate measurements are collectively taken together and used in the algorithm to automatically adjust in real time process parameters so as to obtain a pre-determined state of stress in thin films deposited using PVD.

\* \* \* \* \*